(12) United States Patent
Sakai

(10) Patent No.: US 11,817,530 B2
(45) Date of Patent: Nov. 14, 2023

(54) LIGHT EMITTING DEVICE

(71) Applicants: Citizen Electronics Co., Ltd., Fujiyoshida (JP); Citizen Watch Co., Ltd., Nishitokyo (JP)

(72) Inventor: Keisuke Sakai, Fujiyoshida (JP)

(73) Assignees: Citizen Electronics Co., Ltd., Fujiyoshida (JP); Citizen Watch Co., Ltd., Nishitokyo (JP)

( * ) Notice: Subject to any disclaimer, the term of this patent is extended or adjusted under 35 U.S.C. 154(b) by 0 days.

(21) Appl. No.: 18/013,356

(22) PCT Filed: Jun. 28, 2021

(86) PCT No.: PCT/JP2021/024370
§ 371 (c)(1),
(2) Date: Dec. 28, 2022

(87) PCT Pub. No.: WO2022/004663
PCT Pub. Date: Jan. 6, 2022

(65) Prior Publication Data
US 2023/0231082 A1    Jul. 20, 2023

(30) Foreign Application Priority Data

Jun. 29, 2020   (JP) ................ 2020-111283

(51) Int. Cl.
*H01L 33/48*     (2010.01)
*H01L 33/50*     (2010.01)
*H01L 33/56*     (2010.01)

(52) U.S. Cl.
CPC .......... *H01L 33/486* (2013.01); *H01L 33/502* (2013.01); *H01L 33/56* (2013.01)

(58) Field of Classification Search
CPC .................. H01L 33/56; F21K 9/61
See application file for complete search history.

(56) References Cited

U.S. PATENT DOCUMENTS

2012/0106125 A1* 5/2012 Yokotani ............ F21V 9/38
362/84
2014/0203305 A1   7/2014 Kawano et al.
(Continued)

FOREIGN PATENT DOCUMENTS

JP    2006-086191 A    3/2006
JP    2006-189665 A    7/2006
(Continued)

OTHER PUBLICATIONS

International Preliminary Report on Patentability received in co-pending International Application No. PCT/JP2021/024370, dated Dec. 13, 2022, in 8 pages, with translation.
(Continued)

*Primary Examiner* — Jay C Chang
*Assistant Examiner* — Mikka Liu
(74) *Attorney, Agent, or Firm* — Procopio, Cory, Hargreaves & Savitch LLP

(57) ABSTRACT

A light emitting device includes a substrate, a plurality of first light emitting elements mounted on the substrate, including first LED dies, and emitting light having a first wavelength, and a light guide layer arranged so as to cover the plurality of first light emitting elements, and guiding the light from the plurality of first light emitting elements, wherein when LG1 is a distance between the first LED dies, and θc is a critical angle of the light emitted from the light guide layer to the air, and a thickness T between the upper surfaces of the first light emitting elements and the upper surface of the light guide layer is equal to or longer than T1 indicated by $T1=LG1/(2\tan\theta c)$.

13 Claims, 17 Drawing Sheets

(56) References Cited

U.S. PATENT DOCUMENTS

2019/0097094 A1   3/2019  Han et al.
2019/0129249 A1*  5/2019  Lee .......................... G09G 3/36

FOREIGN PATENT DOCUMENTS

| JP | 2007-180339 A | 7/2007 |
| JP | 2008-041290 A | 2/2008 |
| JP | 2008-198460 A | 8/2008 |
| JP | 2014-138185 A | 7/2014 |
| JP | 6095479 B | 3/2017 |
| JP | 2019-061954 A | 4/2019 |

OTHER PUBLICATIONS

International Search Report received in co-pending International Application No. PCT/JP2021/024370, dated Aug. 3, 2021, in 5 pages, with translation.
Written Opinion received in co-pending International Application No. PCT/JP2021/024370, dated Aug. 3, 2021, in 6 pages, with translation.
Decision to Grant received in co-pending Japan Application No. JP 2022-533999, dated Jul. 26, 2022, in 5 pages, with translation.
Written Opinion with translation received in International Application No. PCT/JP2022/048277, dated Mar. 14, 2023, in 8 pages.

* cited by examiner

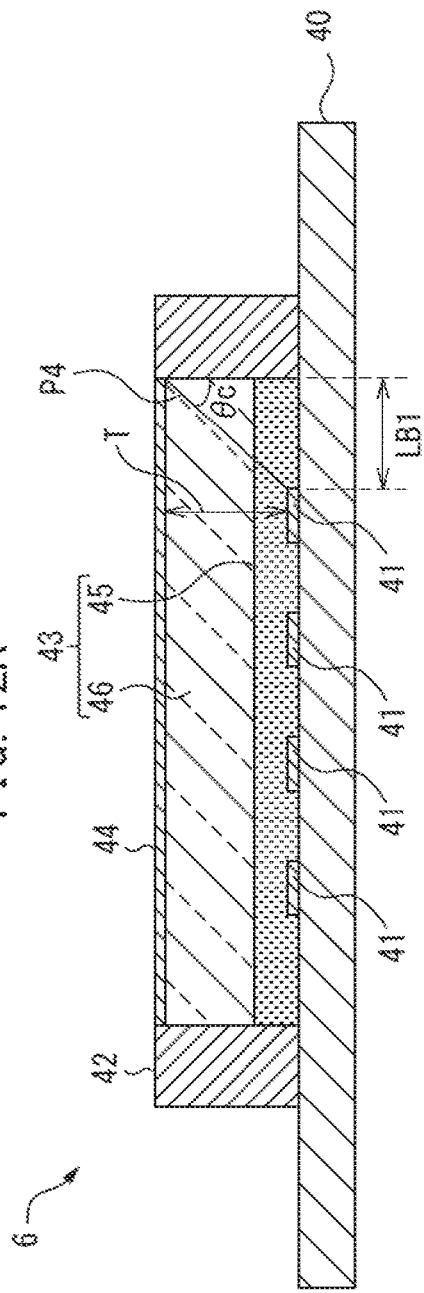
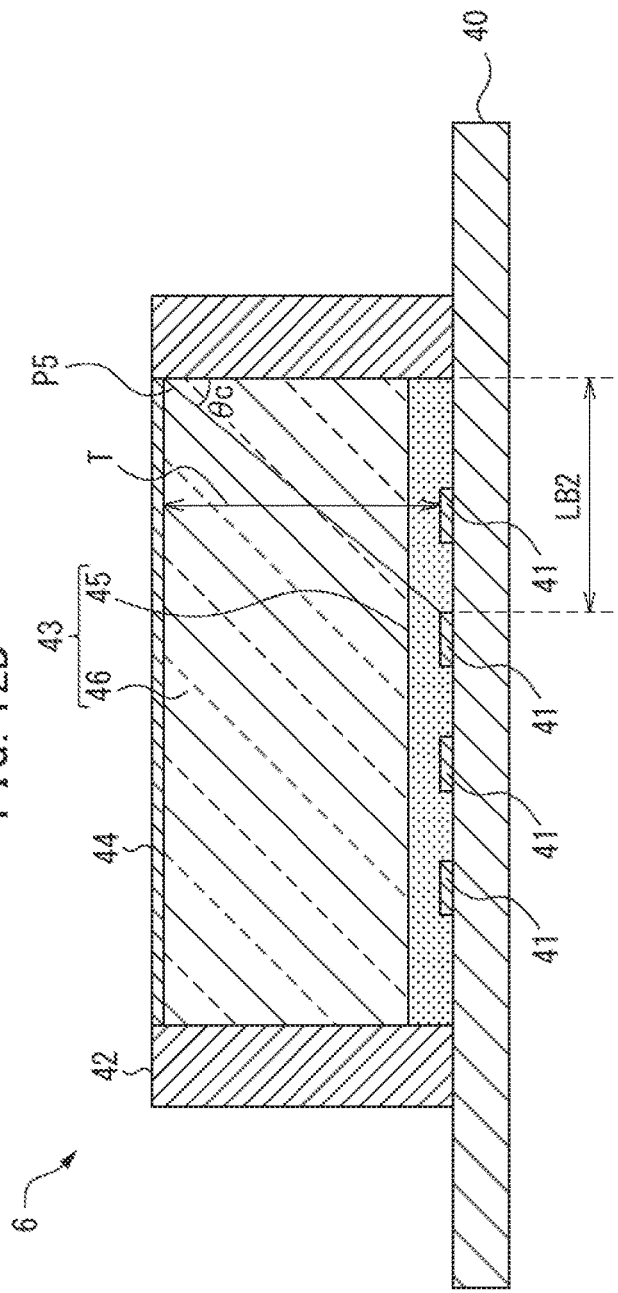

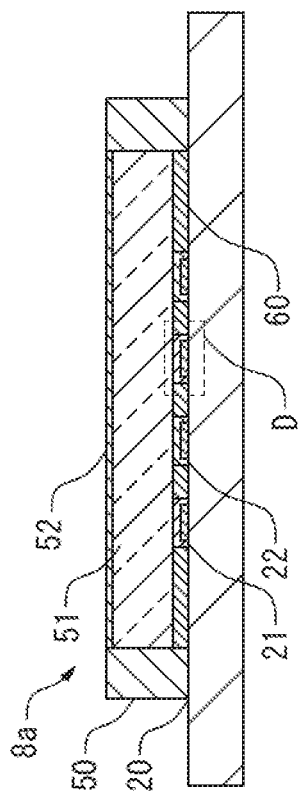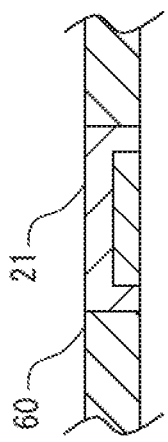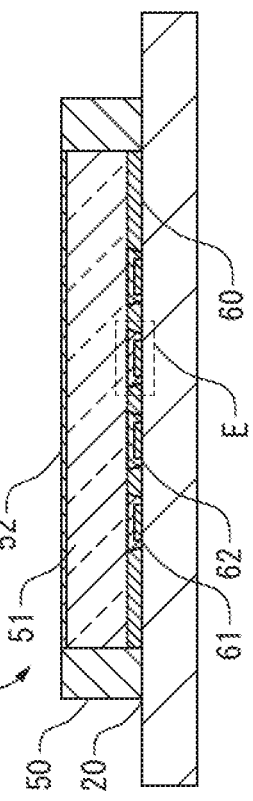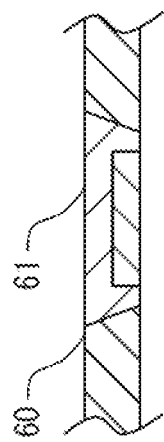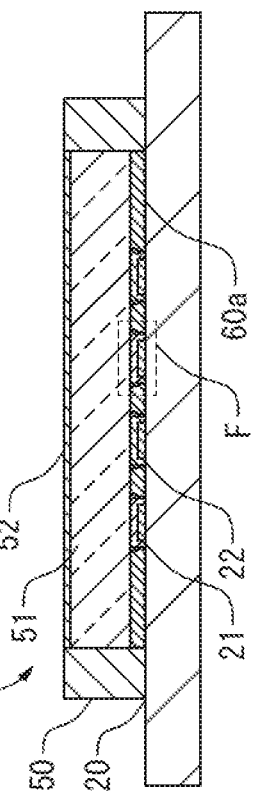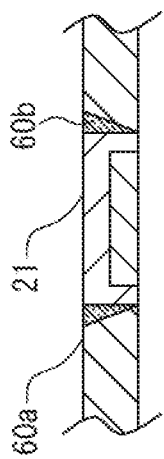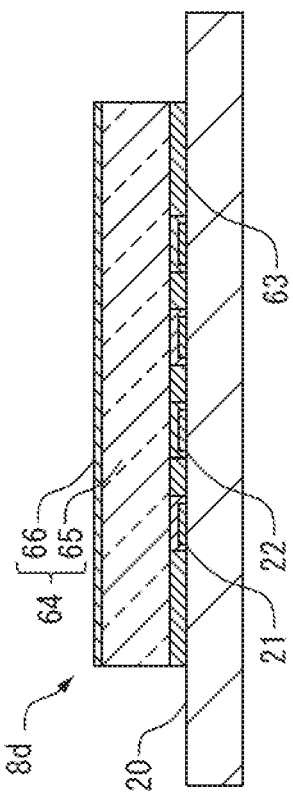

LIGHT EMITTING DEVICE

TECHNICAL FIELD

The present disclosure relates to a light emitting device.

BACKGROUND

A Light emitting device is known that includes a plurality of modularized light emitting elements arranged on the upper surface of a substrate, and attached to a lighting fixture so as to function as a light source of the lighting fixture. The light emitting elements included in the light emitting device are LED dies coated with phosphor, or LED modules formed by packaged LED dies coated with phosphor, etc., and mainly emit light from the upper surfaces thereof. Further, a light emitting device having a large number of arranged light emitting elements is known in a which white LED package is arranged for each color filter section including a large number of color-specific sections. Although various small light emitting elements may be employed as light emitting elements, an LED die is described as an exemplary light emitting element in the present disclosure.

A light emitting device is described in JP 2006-86191 in which light emitting elements having LED dies and phosphor layers for covering the LED dies are arranged in the divided sections formed by dividing the light emitting surface into a plurality of sections by a frame-shaped light shielding member. Further, a light emitting device is described in Japanese Patent No. 6095479 in which chip size packages (CSP) for emitting warm light and CSPs for emitting cool light are arranged alternately, and a white reflective resin is filled between the CSPs. The CSP is an example of a light emitting element that includes a fluorescent resin for coating the upper and side surfaces of an LED die and electrodes formed on the lower surface, and has a planar size similar to that of the LED die.

In the light emitting devices described in JP 2006-86191 and Japanese Patent No. 6095479, a person about 1 m away from the light emitting devices may recognize light emitting elements thereon as graininess when the light emitting devices emit light. When a diffusion plate is arranged between the light emitting devices and the person, the brightness of the light emitted from the light emitting devices is made uniform, and therefore the light emitting elements may be prevented from being recognized as having graininess. It is known that the brightness of the light emitted from the light emitting devices is uniform when a distance between the light emitting devices and the diffusion plate is great, or the diffusion degree of the diffusion plate is increased.

However, the size of a light fixture is large, when the distance between the light emitting devices and the diffusion plate is great. Further, the luminous efficiency of a light fixture is reduced, when the diffusion degree of the diffusion plate is increased. The object of the present disclosure is to provide a light emitting device capable of emitting light having more uniform brightness, in order to overcome the above problem.

A light emitting device according the present disclosure includes a substrate, a plurality of first light emitting elements mounted on the substrate, including first LED dies, and emitting light having a first wavelength, and a light guide layer arranged so as to cover the plurality of first light emitting elements, and guiding the light from the plurality of first light emitting elements, wherein when LG1 is a distance between the first LED dies, and θc is a critical angle of the light emitted from the light guide layer to the air, and a thickness T between the upper surfaces of the first light emitting elements and the upper surface of the light guide layer is equal to or longer than T1 indicated by $$T1 = LG1/(2 \tan \theta c).$$

It is preferable that, when LG2 is a distance between two first LED dies arranged through one first light emitting element, the thickness T between the upper surfaces of the first light emitting elements and the upper surface of the light guide layer is equal to or shorter than T2 indicated by $$T2 = LG2/(2 \tan \theta c).$$

It is preferable that the light emitting device according the present disclosure further includes a plurality of second light emitting elements mounted on the substrate, including second LED dies, and emitting light having a second wavelength different from the first wavelength, wherein the plurality of second light emitting elements are arranged alternately with the first light emitting elements.

It is preferable that the light emitting device according the present disclosure further includes a white resin arranged among the plurality of first light emitting elements and the plurality of second light emitting elements.

It is preferable that each of the first light emitting elements further includes a first fluorescent resin coating the first LED die, each of the second light emitting elements further includes a second fluorescent resin coating the second LED die and side surfaces of the fluorescent resin and second resin are arranged so as to incline outwardthe upper direction.

It is preferable that the light emitting device according the present disclosure further includes transparent resins arrange along the first fluorescent resins and the second fluorescent resins so as to incline outwardthe upper direction.

It is preferable that the light emitting device according the present disclosure further includes a plurality of second light emitting elements mounted on the substrate, including second LED dies, and emitting light having a second wavelength different from the first wavelength, and a plurality of third light emitting elements mounted on the substrate, including third LED dies, and emitting light having a second wavelength different from the first and second wavelengths, wherein a distance between the first LED dies is equal to or longer than the distance between the second LED dies, and between the third LED dies.

It is preferable that the light emitting device according the present disclosure further includes a reflector arranged on the substrate so as to surround the plurality of first light emitting elements, wherein the light guide layer includes a phosphor layer containing phosphor absorbing the light emitted from the first light emitting elements and emitting light having a second wavelength different from the first wavelength, and a transparent layer which does not contain the phosphor, and a distance LB1 between a first light emitting element adjacent to the reflector through one first light emitting element and the reflector is shorter than a distance Ttanθc.

It is preferable that a distance LB1 between a first light emitting element adjacent to the reflector and the reflector is longer than the distance Ttanθc.

It is preferable that the light emitting device according the present disclosure further includes a diffusion layer arranged so as to cover the light guide layer, and emitting the light guided through the light guide layer.

It is preferable that the light emitting device according the present disclosure further includes a diffusion layer arranged so as to cover the light guide layer, and emitting the light guided through the light guide layer.

It is preferable that the light guide layer is integrated with a diffusion layer arranged so as to cover the light guide layer, and emitting the light guided through the light guide layer.

It is preferable that the light emitting device according the present disclosure that the plurality of first light emitting elements are surface mounted type light emitting elements.

It is preferable that the light emitting device according the present disclosure further includes a plurality of electronic components mounted on the substrate: and a control circuit for controlling emissions of light from the plurality of first light emitting elements.

A light emitting device according the present disclosure may emit light having more uniform brightness.

BRIEF DESCRIPTION OF THE DRAWINGS

FIG. 12A is a cross-sectional view of a light emitting device along C-C' shown in FIG. 11 (part 1), FIG. 12B is a cross-sectional view of a light emitting device along C-C' shown in FIG. 11 (part 2), FIG. 14A is a cross-sectional view of a light emitting device according to a sixth modification, FIG. 14B is a cross-sectional view of a light emitting device according to a seventh modification, FIG. 14C is a cross-sectional view of a light emitting device according to an eighth modification, FIG. 14D is a cross-sectional view of a light emitting device according to a ninth modification, FIG. 14E is an enlarged view of a portion indicated by an arrow D in FIG. 14A, FIG. 14F is an enlarged view of a portion indicated by an arrow E in FIG. 14B, FIG. 14G is an enlarged view of a portion indicated by an arrow F in FIG. 14C.

DESCRIPTION

Figure 1A:
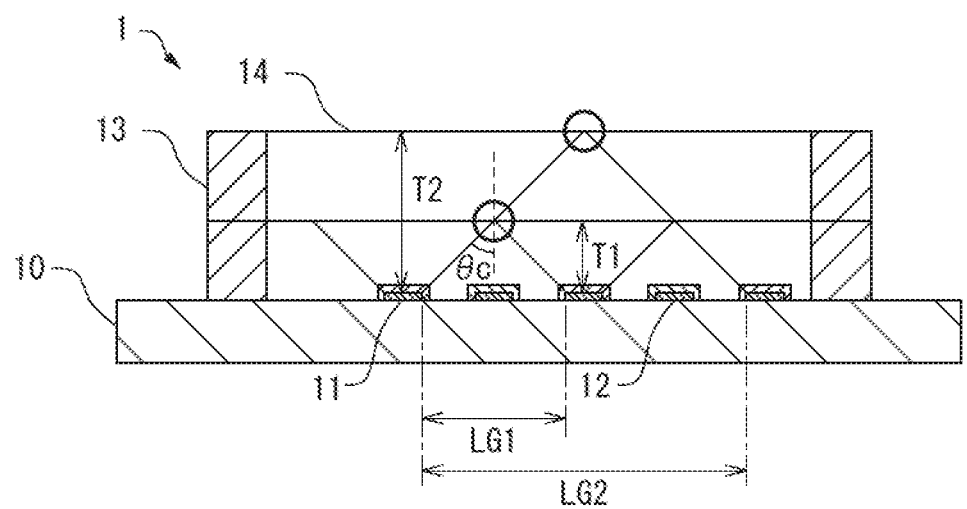
FIG. 1A is a diagram for explaining an outline of a light emitting device according to the present disclosure (Part 1)

Hereinafter, with reference to the drawings various embodiments will be explained. However, the technical scope of the present disclosure is not limited to these embodiments, but spans the claimed invention and its equivalents. Further, in the description of the drawings, the same or corresponding components are denoted by the same reference numerals, and overlapping descriptions are omitted. For the sake of explanation, the scales of the members are appropriately changed.

(Outline of a Light Emitting Device According to the Present Disclosure)

Figure 1B:
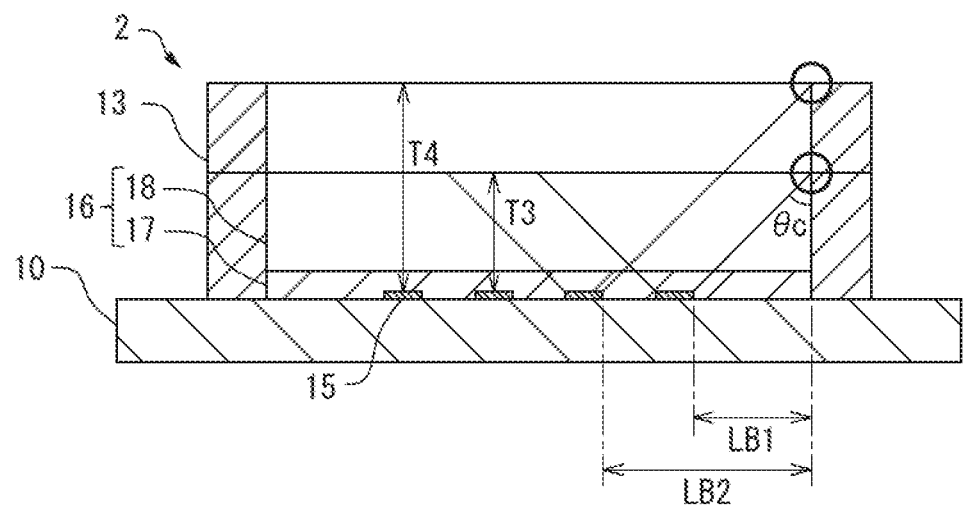
FIG. 1B is a diagram for explaining an outline of a light emitting device according to the present disclosure (Part 2)

FIG. 1A is a diagram for explaining an outline of a light emitting device according to the present disclosure (Part 1), and FIG. 1B is a diagram for explaining an outline of the light emitting device according to the present disclosure (Part 2). FIGS. 1A and 1B are cross-sectional views of light emitting devices according to the present disclosure.

The light emitting device 1 includes a substrate 10, first light emitting elements 11, second light emitting elements 12, a reflector 13 and a light guide layer 14. The substrate 10 is formed of a high thermal conductivity member such as ceramic and aluminum, the first and second light emitting elements 11 and 12 are mounted on the substrate 10. The first and second light emitting elements 11 and 12 are CSP type light emitting elements having LED dies and sealing materials such as a silicone resins in which phosphor for emitting light having a first wavelength and a second wavelength by converting a wavelength light emitted from of each of the LED dies. The reflector 13 is formed of a silicone resin containing white particles such as Titanium Oxide (TiO2), and is arranged so as to surround the first and second light emitting elements 11 and 12. The light guide layer 14 is a silicone resin for transmitting light emitted from the first and second light emitting elements 11 and 12, and is filled in a region surrounded by the reflector 13. The light emitting device 1 emits light having highly uniform brightness, when a thickness T between upper surfaces of the LED dies of the first and second light emitting elements 11 and 12 and the upper surface of the light guide layer 14 is equal to or longer than T1 and equal to or shorter than T2.

When a distances between LED dies of adjacent first light emitting elements 11 are an LG1, and the critical angle when light is emitted from the light guide layer 14 to the air is θc, the minimum value T1 of the thickness T between the upper surfaces of the LED dies of the first light emitting elements 11 and the upper surface of the light guide layer 14 is indicated by $$T1 = LG1/(2 \tan \theta c) \qquad (1)$$

Further, when a distance between LED dies of two first light emitting elements 11 arranged through one first light emitting element 11 are LG2, the maximum value T2 of the thickness T between the upper surfaces of the LED dies of the first light emitting elements 11 and the upper surface of the light guide layer 14 is indicated by $$T2 = LG2/(2 \tan \theta c) \qquad (2)$$

It is preferable that the thickness T between the upper surfaces of the LED dies of the first light emitting elements 11 and the upper surface of the light guide layer 14 is equal to or longer than 1 mm and equal to or shorter than 1.5 mm.

In the light emitting device 1, when the thickness T between the upper surfaces of the LED dies of the first light emitting elements 11 and the upper surface of the light guide layer 14 is equal to or longer than T1, light emitted from the first light emitting elements 11 is emitted over the entire upper surface of the light guide layer 14. Further, the light emitting device 1, when the thickness T between the upper surfaces of the LED dies of the first light emitting elements 11 and the upper surface of the light guide layer 14 is equal to or shorter than T2, a thickness of the light guide layer 14 is thinner, and therefore an increase of manufacturing cost may be suppressed, and the luminous efficiency may be prevented from reducing. The heights of the LED dies of the second light emitting elements 12 are the same as those of the first light emitting elements 11, and the arrangement pitches of the LED dies of the second light emitting elements 12 are the same as those of the first light emitting elements 11.

Although a CSP type light emitting element is employed in the light emitting device 1, the light emitting device 1 may be a chip-on-board (COB) type light emitting device mounting LED dies on the substrate, or a surface mounted (SMD) type light emitting device.

A light emitting device 2 is different from the light emitting device 1 in that the light emitting device 2 includes first light emitting elements 15 and light guide layer 16 instead of first light emitting elements 11, the second light emitting elements 12 and a light guide layer 14. The first light emitting elements 15 are LED dies for emitting light having a first wavelength. The light guide layer 16 includes a phosphor layer 17 and a transparent layer 18. The phosphor layer 17 is a silicone resin in which phosphor that emits light having a second wavelength by converting the wavelength of the light emitted from the first light emitting elements 15 is contained. The transparent layer 18 is a silicone resin that transmits light emitted from the first light emitting elements 15 and the phosphor contained in the phosphor layer 17. The light emitting device 2 suppresses the occurrence of a yellow rolling, when a thickness T between the upper surfaces of the first light emitting elements 15 and the upper surface of the light guide layer 16 is equal to or longer than T3 and equal to or shorter than T4.

When a distance between a first light emitting element 15 adjacent to the reflector 13 and the reflector 13 is LB1, The minimum value T3 of the thickness T between the upper surfaces of the first light emitting elements 15 and the upper surface of the light guide layer 16 is indicated by $$T3 = LG1/(2 \tan \theta c) \qquad (3)$$

In other words, the distance LB1 between the first light emitting element 15 adjacent to the reflector 13 and the reflector 13 is shorter than $T\tan\theta c$. Further, when a distance between a first light emitting element 15 arranged adjacent to the reflector 13 through one first light emitting element 15 and the reflector 13 is LB2, the maximum value T4 of the thickness T between the upper surface of the first light emitting elements 15 and the upper surface of the light guide layer 16 is indicated by $$T4 = LG1/(2 \tan \theta c) \qquad (4)$$

The distance LB2 between the first light emitting element 15 arranged adjacent to the reflector 13 through one first light emitting element 15 and the reflector 13 is longer than the $T\tan\theta c$.

In the light emitting device 2, light emitted from the first light emitting element 15 adjacent to the reflector 13 is emitted to the outer edge of the upper surface of the light guide layer 16 contacted with an inner edge of the reflector 13, when the thickness T between the upper surfaces of the first light emitting elements 15 and the upper surface of the light guide layer 16 is equal to or longer than T3. In the light emitting device 2, when the light emitted from the first light emitting element 15 is emitted to the outer edge of the upper surface of the light guide layer 14 contacted with an inner edge of the reflector 13, only light emitted from the phosphor contained in the phosphor layer 17 is not emitted to the outer edge of the upper surface of the light guide layer 16, and therefore the yellow rolling does not occur. Further, in the light emitting device 2, when the thickness T between the upper surfaces of the first light emitting elements 15 and the upper surface of the light guide layer 16 is equal to or shorter than T4, the thickness of the light guide layer 16 may be prevented from being thicker, and therefore the luminous efficiency may be prevent from being lower, and an increase of the manufacturing cost may be suppressed.

(Configuration and Function of the Light Emitting Device According to the First Embodiment)

Figure 2:
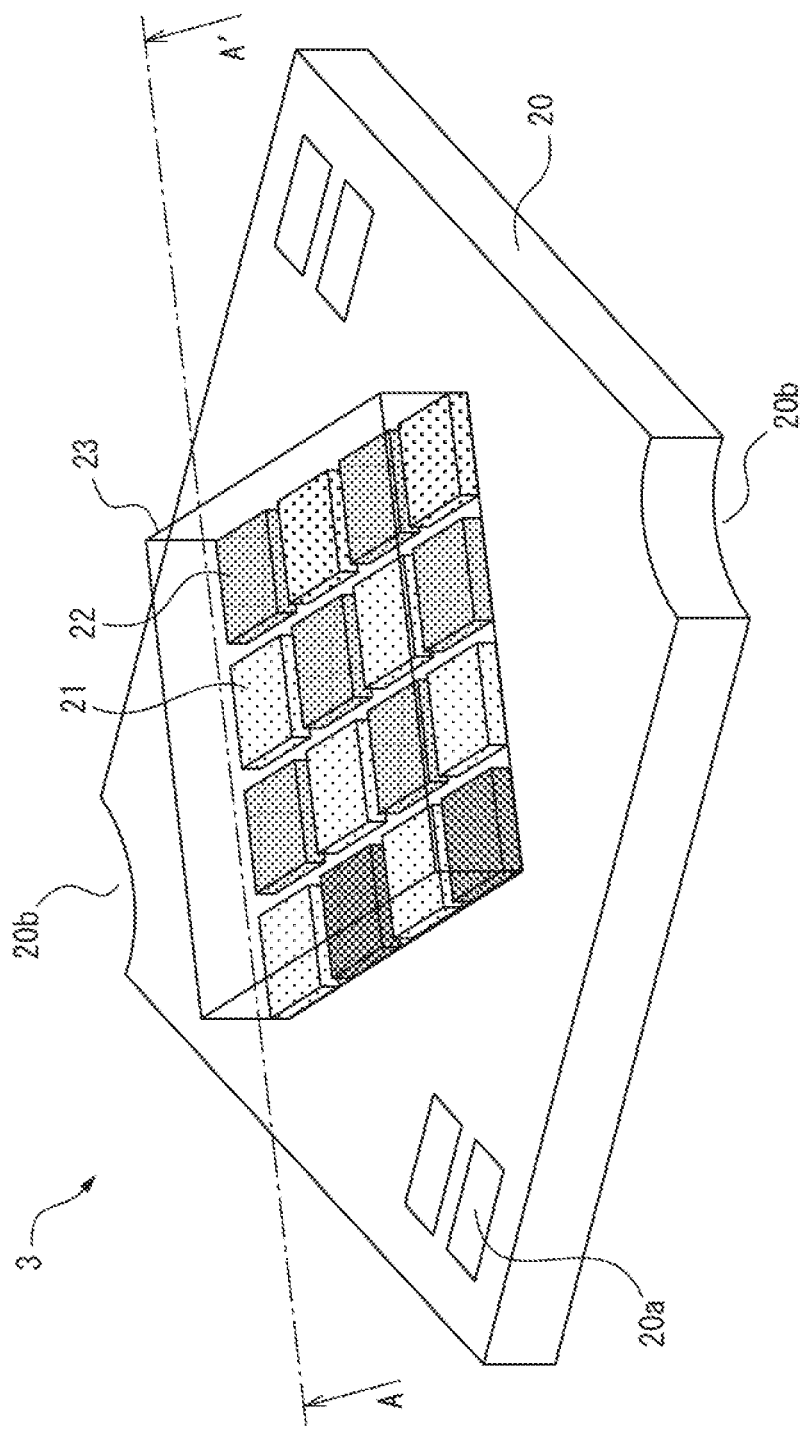
FIG. 2 is a perspective view of a light emitting device according to the first embodiment.
Figure 3:
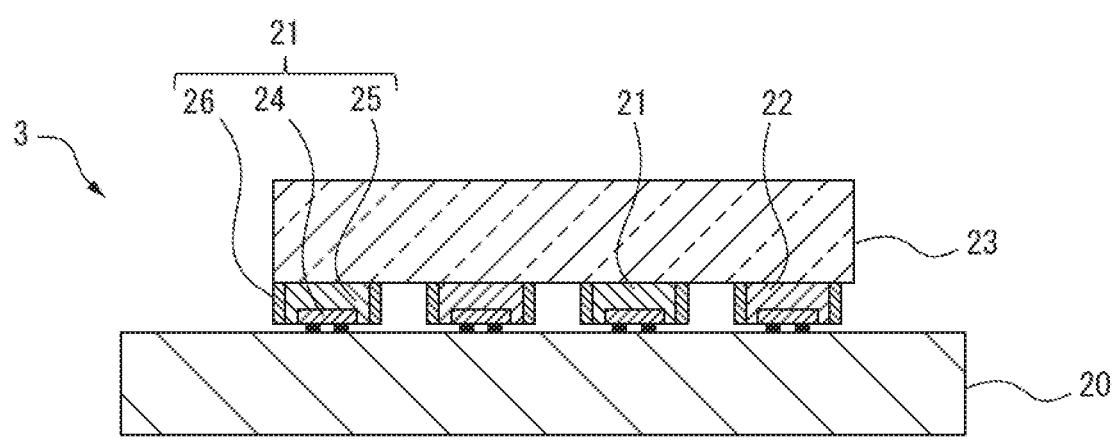
FIG. 3 is a cross-sectional view along a line A-A' in FIG. 1

FIG. 2 is a perspective view of a light emitting device according to the first embodiment, and FIG. 3 is a cross-sectional view along a line A-A' in FIG. 2. A light emitting device 3 includes a substrate 20, eight first light emitting elements 21 and eight second light emitting elements 22 mounted on the upper surface of the substrate 20, a sheet type light guide layer 23 arranged on the first and second light emitting elements 21 and 22. It is preferable that the upper surface of the sheet type light guide layer 23 is flat. Since manufacturing methods for the light emitting device 3 are well known, a detailed description thereof will be omitted.

The substrate 20 is an insulating substrate having a high reflectivity and thermal conductivity such as ceramics, power supply electrodes 20a are formed near one pair of corners, cuttings 20b for screwing are formed in the other pair of corners. The first and second light emitting elements 21 and 22 are arranged in a matrix of 4×4 on the upper surface of the substrate 20. Further, the first and second light emitting elements 21 and 22 are arranged in a checkerboard pattern. The light guide layer 23 is formed of a silicone resin, and is arranged so as to cover the first and second light emitting elements 21 and 22. The light guide layer 23 contains no diffusion materials referred to as fillers. In FIG. 2, wires connecting among the power supply electrodes 20a, and the first and second light emitting elements 21 and 22 are omitted.

Each of the first and second light emitting elements 21 and 22 has a rectangular planar shape of 1.7 mm×1.7 mm, and includes an LED die 24, a fluorescent resin 25 and a reflection frame 26. The LED dies 24 and the fluorescent resins 25 included in the first light emitting elements 21 are also referred to as first LED dies and first fluorescent resins, and the LED dies 24 and the fluorescent resins 25 included in the second light emitting elements 22 are also referred to as second LED dies and second fluorescent resins. Each of the LED dies 24 is a blue light emitting diode having a rectangular planar shape of 1.0 mm×1.0 mm, and includes a sapphire substrate arranged in upper portion of the LED die, a light emitting layer formed below the sapphire substrate, and an anode and cathode electrodes arranged on the lower surface of the LED die. The dominant wavelength of blue light emitted from LED die 24 is between 445 nm and 495 nm, and, for example, is 450 nm. The fluorescent resin 25 is a silicone resin containing phosphor such as YAG, and coats the upper and side surfaces of the LED die 24, and wavelength-converts a portion of the light emitted from the LED dies 24. The reflection frame 26 is a silicone resin containing reflective fine particles such as titanium oxide, surrounds the fluorescent resin 25, and the light emitted from LED die 24 is directed upward by the reflection frame 26. The content of the phosphor contained in the fluorescent resin 25 of the first light emitting element 21 is different from that of the second light emitting element 22, the first light emitting element 21 emits light having a first wavelength, and the second light emitting element 22 emits light having a second wavelength different from the first wavelength. The light emitted from the first light emitting element 21 and having the first wavelength is cold light whose color temperature is, for example, 5000K, and light emitted from the second light emitting element 22 and having a second wavelength is warm light whose color temperature is, for example, 2700K.

The first and second light emitting elements 21 and 22 are flip-chip mounted on the upper surface of the substrate 20. The light guide layer 23 is adhered on the upper surfaces of the first and second light emitting elements 21 and 22 by adhesive materials.

Figure 4:
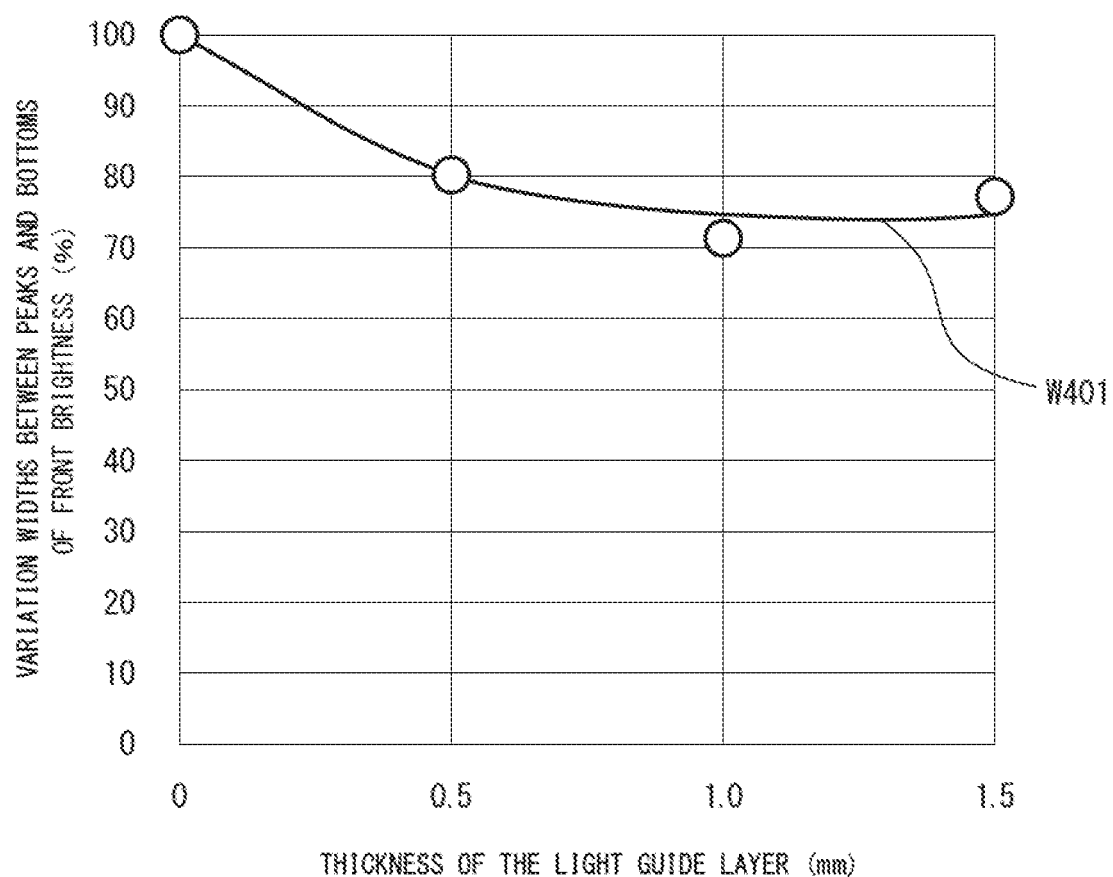
FIG. 4 is a diagram showing characteristics of the light emitting device shown FIG. 1.

FIG. 4 is a diagram showing a relationship between a front brightness of the light emitting device 3 and thicknesses of the light guide layer 23. The front brightness of the light emitting device 3 is measured along a line A-A' shown in FIG. 2, the brightness of the light emitted from the first light emitting elements 21 and the second light emitting element 22 is adjusted to be similar to each other.

A vertical axis of FIG. 4 indicates variation widths of the peaks and bottoms of the front brightness, and the horizontal axis indicates the thickness (mm) of the light guide layer 23. The front brightness of the light emitted from the light emitting device 3 is maximized just above the first and second light emitting elements 21 and 22, and minimized at the midpoints between the first light emitting elements 21 and the second light emitting elements 22. In FIG. 4, a curve W401 indicates variation ranges which are the difference between the peak values (maximum values) of the front brightness and the bottom values (minimum values) thereof. The variation ranges of the front brightness indicated by the curve W401 are normalized, so that the variation value is 100% when the thickness of the light guide layer 23 is zero, i.e., the light guide layer 23 is not arranged.

The thicker the light guide layer 23 is, the lower variation widths of the front brightness of the light emitted from the first and second light emitting elements 21 and 22, and the variation is reduced when the thickness of the light guide layer 23 is over 1 mm.

Figure 5:
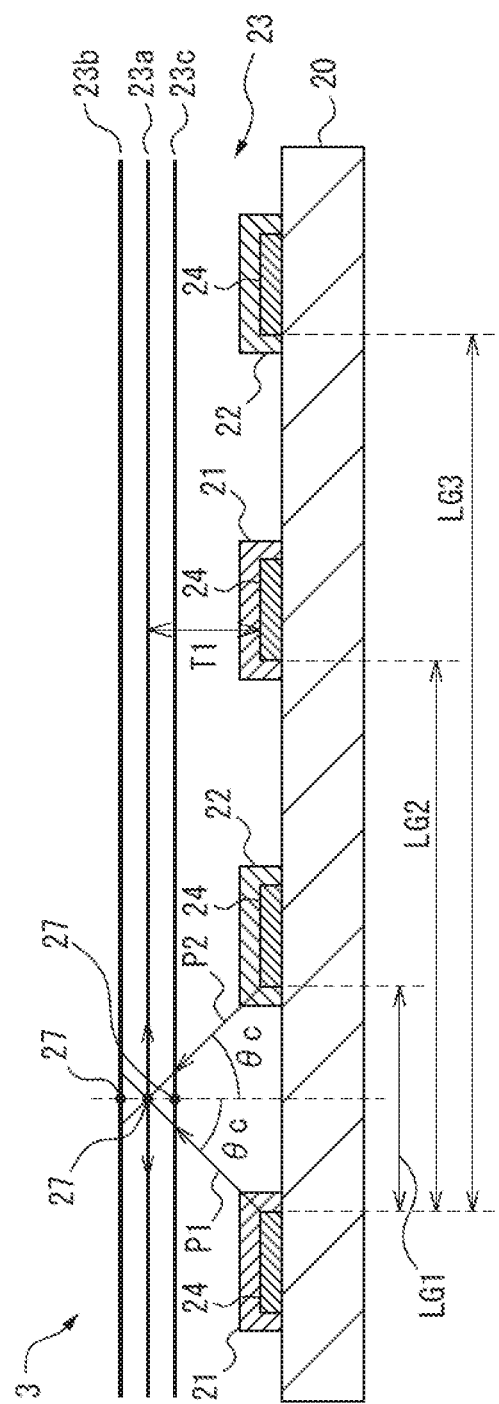
FIG. 5 is a diagram for explaining the thickness of a light guide layer shown in FIG. 2 (Part 1)

FIG. 5 is an explanatory view of an example of a lower value of the thickness between the upper surfaces of the LED dies 24 of the first and second light emitting elements 21 and 22 and the upper surface of the light guide layer 23, and is a cross-sectional view of the light emitting device 3 along the line A-A' shown in FIG. 2. FIG. 5 is exaggeratingly illustrated so that the distances between the first light emitting elements 21 and the second light emitting elements 22 are increased. In FIG. 5, positions of the upper surfaces of the light guide layer 23 are indicated as a first position 23*a*, a second position 23*b* and a third position 23*c*. The first position 23*a* is a position of the upper surface of the light guide layer 23 when the thickness is a lower limit value, the second position 23*b* is a position of the upper surface of the light guide layer 23 when the thickness is greater than the lower limit value, and the third position 23*c* is a position of the upper surface of the light guide layer 23 when the thickness is less than the lower limit value.

A distance between an LED die 24 of a first light emitting element 21 and an LED die 24 of a second light emitting element 22 adjacent to the first light emitting element 21 is LG1, a distance between LED dies 24 of adjacent first light emitting elements 21 is LG2, and a distance between an LED die 24 of a first light emitting element 21 and an LED die 24 of a second light emitting element 22 arranged through one first light emitting element 21 and one second light emitting element 22 is LG3. Light P1 is emitted from a side facing a second light emitting element 22 of a first light emitting element 21, and is incident to the upper surface of the light guide layer 23 at a critical angle θc. Light P2 is emitted from a side facing the first light emitting element 21 of the second light emitting element 22, and is incident to the upper surface of the light guide layer 23 at a critical angle θc.

A thickness between the upper surfaces of the LED dies 24 of the first and second light emitting elements 21 and 22 and the upper surface of the light guide layer 23 that is the first position 23*a* is indicated by T1. When the critical angle θc of light emitted from the light guide layer 23 to the air and a distance LG1 between a first light emitting element 21 and a second light emitting element 22 are used, the thickness T1 between the upper surfaces of the LED dies 24 of the first and second light emitting elements 21 and 22 and the upper surface of the light guide layer 23 is indicated by $$T1 = LG2/(2 \tan \theta c) \quad (1)$$

When the thickness between the upper surfaces of the LED dies 24 of the first and second light emitting elements 21 and 22 and the upper surface of the light guide layer 23 is T1, the light P1 and the light P2 intersect at an intersection 27 at which a medium line between LED dies 24 of the first light emitting element 21 and the second light emitting element 22, and the upper surface of the light guide layer 23 intersect.

No dark lines are generated, when a position of the upper surface of the light guide layer 23 is the second position 23*b*, and the thickness between the upper surfaces of the LED dies 24 of the first and second light emitting elements 21 and 22 and the upper surface of the light guide layer 23 is thicker than T1. Light is emitted from the upper surface of the light guide layer 23 to the outside at the intersection 27, when the thickness between the upper surfaces of the LED dies 24 of the first and second light emitting elements 21 and 22 and the upper surface of the light guide layer 23 is thicker than T1. On the other hand, a portion having a band shape is generated, when a position of the upper surface of the light guide layer 23 is the third position 23*c*, and the thickness between the upper surfaces of the LED dies 24 of the first and second light emitting elements 21 and 22 and the upper surface of the light guide layer 23 is thinner than T1. Light does not emit to the outside in the vicinity of the intersection 27, when the thickness between the upper surfaces of the LED dies 24 of the first and second light emitting elements 21 and 22 and the upper surface of the light guide layer 23 is thinner than T1.

The uniformity of brightness of the light emitted from the light emitting device 3 is improved, when the thickness between the upper surfaces of the LED dies 24 of the first and second light emitting elements 21 and 22 and the upper surface of the light guide layer 23 is equal to or longer than T1. When the thickness between the upper surfaces of the LED dies 24 of the first and second light emitting elements 21 and 22 and the upper surface of the light guide layer 23 is equal to or longer than T1, the light having highly uniformity of brightness is emitted, the brightness of the light emitted from a light fixture mounting the light emitting device 3 is further uniformed, by combining a diffuser having a low diffusivity.

Figure 6:
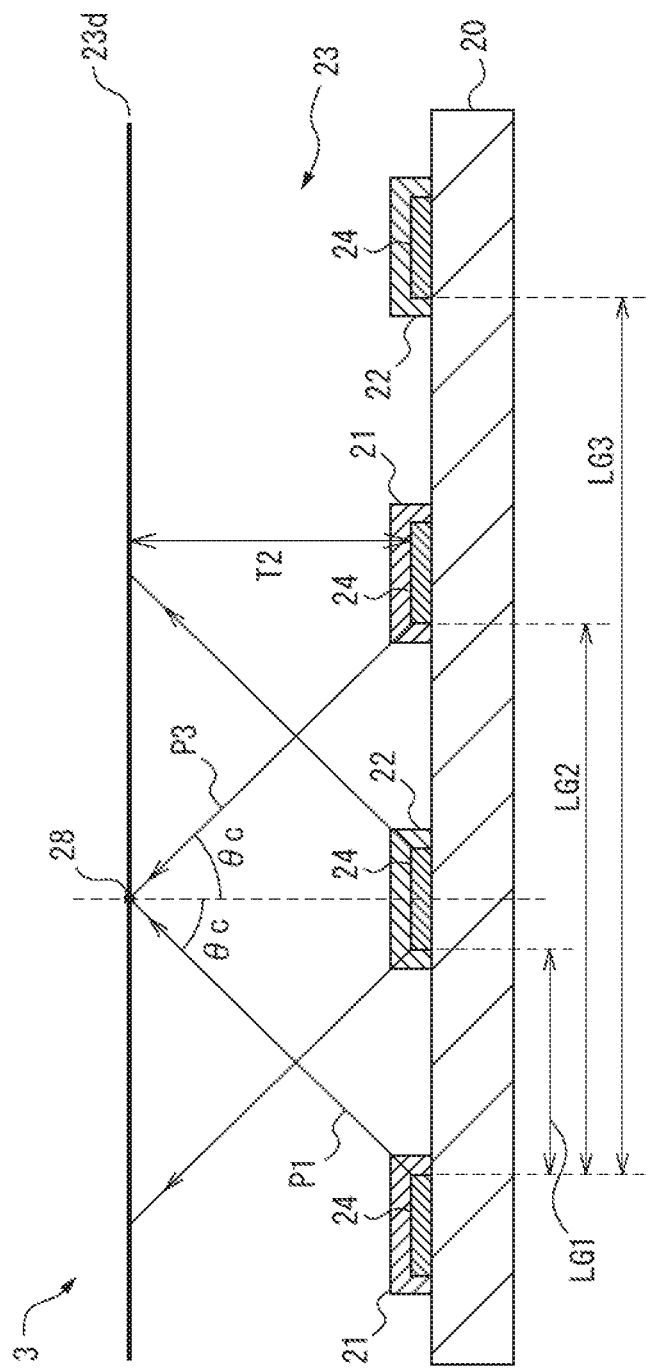
FIG. 6 is a diagram for explaining the thickness of a light guide layer shown in FIG. 2 (Part 2)

FIG. 6 is an explanatory diagram of an optimum value and an upper limit value of the thickness T between the upper surfaces of the LED dies 24 of the first and second light emitting elements 21 and 22 and the upper surface of the light guide layer 23, and is a cross-sectional view of the light emitting device 3 along the line A-A' shown in FIG. 2.

Light P1 is emitted from a side facing a second light emitting element 22 of an LED die 24 of a first light emitting element 21, and is incident to the upper surface of the light guide layer 23 at a critical angle θc. Light P3 is emitted from a side facing the second light emitting element 22 of an LED die 24 of a first light emitting element 21 adjacent to the LED die 24 of the first light emitting element 21 emitting light P1 arranged through the second light emitting element 22, and is incident to the upper surface of the light guide layer 23 at a critical angle θc. The light P1 and the light P3 intersect at the intersection 28 of the upper surface of the light guide layer 23, when a position of the upper surface of the light guide layer 23 is a fourth position 23d, and the thickness between the upper surfaces of the LED dies 24 of the first and second light emitting elements 21 and 22 and the upper surface of the light guide layer 23 is T2.

When the critical angle θc when the light is emitted from the light guide layer 23 to the air, and the distance LG2 between LED dies 24 of adjacent first light emitting elements 21 arranged through a second light emitting element 22 are used, the thickness T2 between the upper surfaces of the LED dies 24 of the first and second light emitting elements 21 and 22 and the upper surface of the light guide layer 23 is indicated by $$T2 = LG2/(2 \tan \theta c) \quad (2)$$

In the light emitting device 3, light emitted from the second light emitting element 22 in the upward direction is emitted to the outside from the upper surface of the light guide layer 23 in the vicinity of the intersection 28 of the upper surface of the light guide layer 23. The light emitting device 3 uniformly emits light to the outside from the entire upper surface of the light guide layer 23.

The refractive index of the light guide layer 23 formed of a silicone resin is 1.4, and therefore the critical angle θc is about 45°. Further, the distance LG1 between the LED dies 24 of the first and second light emitting elements and 21 and 22 is 0.3 mm, and the distance LG2 between the LED dies 24 of the first light emitting elements 21 is 2.3 mm. When the critical angle θc is 45°, the distance LG1 is 0.3 mm, and the distance LG2 is 2.3 mm, T1 calculated by the equation (1) is 0.15 mm. Further, T2 calculated by the equation (2) is 1.15 mm. When the thickness T of the light guide layer 23 exceeds 1 mm, the amount of change i.e., the attenuation amount is reduced, and therefore the curve W401 is saturated. The variation width of the front brightness corresponding to the curve W401 is saturated, when the thickness T between the upper surfaces of the LED dies 24 of the first and second light emitting elements 21 and 22 and the upper surface of the light guide layer 23 is at about 80% of T2.

When the thickness between the upper surfaces of the LED dies 24 of the first and second light emitting elements 21 and 22 and the upper surface of the light guide layer 23 is 0.15 mm, i.e., T1, the value of the curved line W401 is about 95%. When the thickness between the upper surfaces of the LED dies 24 of the first and second light emitting elements 21 and 22 and the upper surface of the light guide layer 23 is 1.15 mm, i.e., T2, the value of the curved line W401 is about 75%.

In the light emitting device 3, when the thickness T between the upper surfaces of the LED dies 24 of the first and second light emitting elements 21 and 22 and the upper surface of the light guide layer 23 is equal to or longer than T1, the uniformity of the brightness of the emitted light is improved. However, when the thickness T between the upper surfaces of the LED dies 24 of the first and second light emitting elements 21 and 22 and the upper surface of the light guide layer 23 is in the vicinity of T1, it is preferable to arrange a diffusion layer on the light guide layer 23, in order to further improve the uniformity of the brightness of the emitted light.

Further, the thickness T of the light guide layer 23 is increased, the luminous efficiency and the handling property are lowered. On the other hand, when the thickness T between the upper surfaces of the LED dies 24 of the first and second light emitting elements 21 and 22 and the upper surface of the light guide layer 23 is equal to or longer than 1.0 mm, the variation range of the front brightness is saturated. An upper limit value of the thickness between the upper surfaces of the LED dies 24 of the first and second light emitting elements 21 and 22 and the upper surface of the light guide layer 23 may be T2'=LG3/(2 tan θc). In the light emitting device 3, the thickness between the upper surfaces of the LED dies 24 of the first and second light emitting elements 21 and 22 and the upper surface of the light guide layer 23 is preferably equal to or longer than T1 and equal to or shorter than T2'. Specifically, the thickness T between the upper surfaces of the LED dies 24 of the first and second light emitting elements 21 and 22 and the upper surface of the light guide layer 23 is preferably equal to or longer than 1.0 mm and equal to or shorter than 1.5 mm.

Since the light guide layer 23 is preferable thinner in order to suppress a decrease of the luminous efficiency, an optimum value of the thickness T between the upper surfaces of the LED dies 24 of the first and second light emitting elements 21 and 22 and the upper surface of the light guide layer 23 is T2. When the thickness between the upper surfaces of the LED dies 24 of the first and second light emitting elements 21 and 22 and the upper surface of the light guide layer 23 is 0.5 mm, i.e. the vicinity of 0.5 T2, the variation range of the front brightness from is reduced, and therefore the thickness T is preferably equal to or longer than 0.5 T2 and equal to or shorter than T2'.

Referring to FIGS. 4 to 6, it is explained that the uniformity of the luminance is improved. However, the light emitting device 3 may emit light having an intermediate color between a color of the light emitted from the first light emitting elements 21 and a color of the light emitted from the second light emitting elements 22, by adjusting the relative intensity of light emitted from the first light emitting elements 21 and the second light emitting elements 22. It is desirable to improve color distribution i.e. color mixing property of the light emitted from the first light emitting elements 21 and the second light emitting elements 22 on the upper surface of the light guide layer 23.

(Configuration and Function of the Light Emitting Device According to the Second Embodiment)

Figure 7:
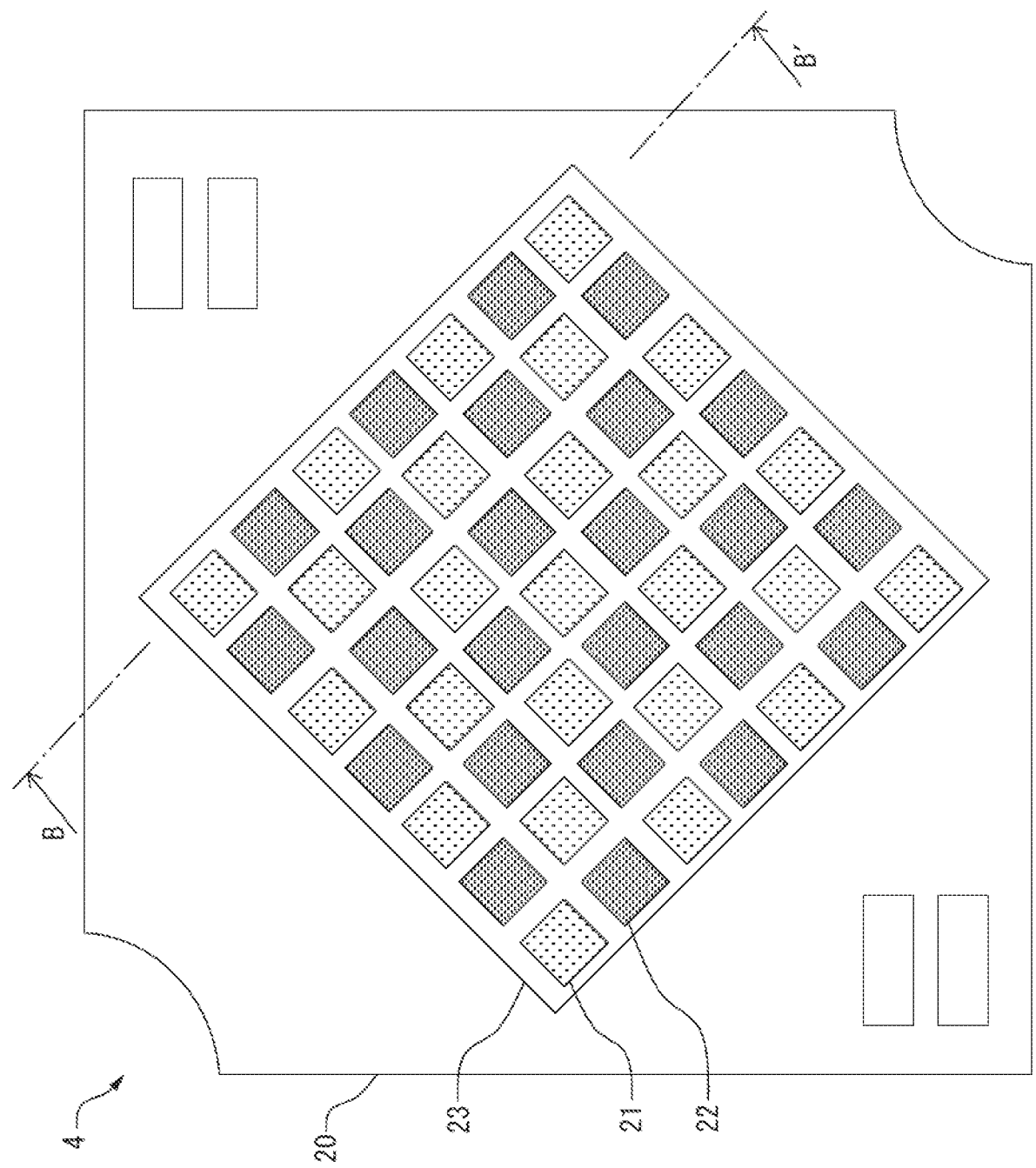
FIG. 7 is a plan view of a light emitting device according to the second embodiment.

FIG. 7 is a plan view of a light emitting device according to the second embodiment.

The number of the first and second light emitting elements 21 and 22 mounted on light emitting device 4 is different from the number of the first and second light emitting elements 21 and 22 mounted on the light emitting device 3. Since the configuration and function of the light emitting device 4 except for the number of the first light emitting elements 21 and the second light emitting elements 22 is the same as those of the light emitting device 3, a detailed description thereof will be omitted.

The first light emitting elements 21 and the second light emitting elements 22 are arranged in a matrix of 7×7 on the upper surface of the substrate 20. The first light emitting elements 21 and the second light emitting elements 22 are arranged in a checkerboard pattern on the upper surface of the substrate 20.

Figure 8:
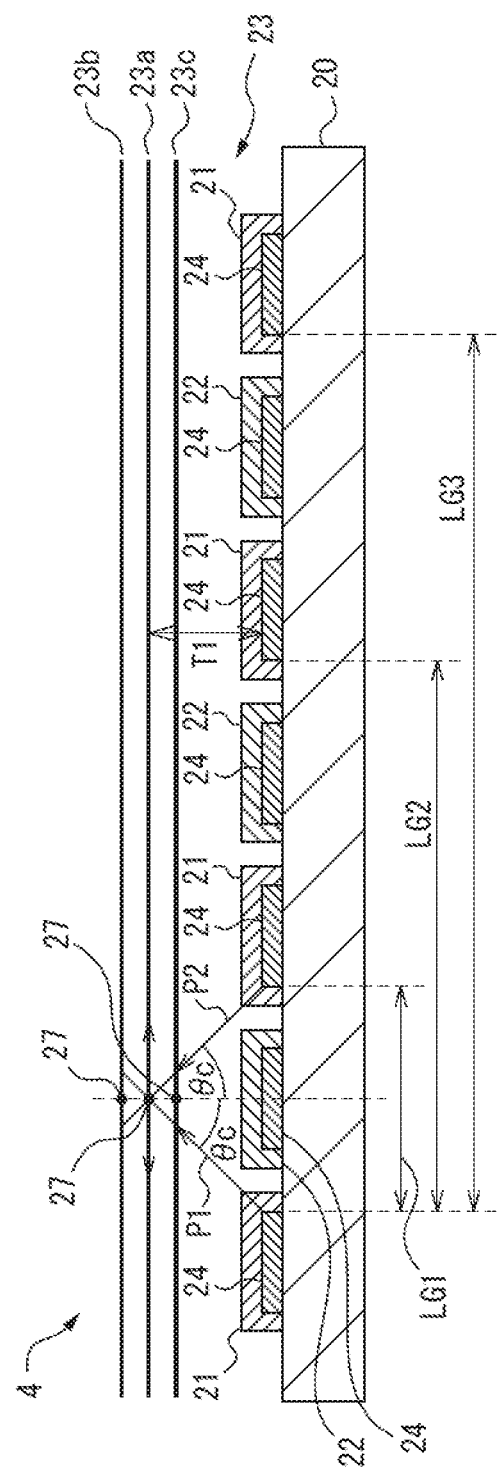
FIG. 8 is a diagram for explaining the thickness of a light guide layer shown in FIG. 7 (Part 1)

FIG. 8 is an explanatory view of the lower limit value of the thickness T between the upper surfaces of the LED dies 24 of the first and second light emitting elements 21 and 22 and the upper surface of the light guide layer 23, and is a cross-sectional view of the light emitting device 4 along a line B-B' in FIG. 8.

A distance between LED dies 24 of adjacent first light emitting elements 21 arranged through one second light emitting element 22 is LG1, and a distance between LED dies 24 of the two first light emitting elements 21 arranged through one first light emitting element 21 and two second light emitting elements 22 is LG2. Further, a distance between LED dies 24 of two first light emitting elements 21 arranged through two first light emitting elements 21 and three second light emitting elements 22 is LG3. Light P1 is emitted from a side facing a second light emitting element 22 of the LED die 24 of a first light emitting element 21, and is incident to the upper surface of the light guide layer 23 at a critical angle θc. Light P2 is emitted from a side of a first light emitting element 21 facing a second light emitting element 22 arranged at the side of the first light emitting element 21 emitting the light P1 arranged through the second light emitting element 22, and is incident to the upper surface of the light guide layer 23 at a critical angle θc.

A thickness between the upper surfaces of the LED dies 24 of the first and second light emitting elements 21 and 22 and the upper surface of the light guide layer 23 is indicated by T1. The thickness T1 between the upper surfaces of the LED dies 24 of the first and second light emitting elements 21 and 22 and the upper surface of the light guide layer 23 has a relation indicated by the equation (1) with respect to the critical angle θc of light emitted from the light guide layer 23 into the air and the distance LG1 between LED dies 24 of adjacent first light emitting elements 21 through one second light emitting element 22.

When a position of the upper surface of the light guide layer 23 is the second position 23b, and the thickness between the upper surfaces of the LED dies 24 of the first and second light emitting elements 21 and 22 and the upper surface of the light guide layer 23 is equal to or longer than T1, the light emitted from the first light emitting elements 21 and the second light emitting elements 22 are color mixed over the entire upper surface of the light guide layer 23. When a position of the upper surface of the light guide layer 23 is the third position 23c, and the thickness between the upper surfaces of the LED dies 24 of the first and second light emitting elements 21 and 22 and the upper surface of the light guide layer 23 is thinner than T1, the light emitted from the first and second light emitting elements 21 and 22 are not color mixed in the vicinity of the intersection 27.

Figure 9:
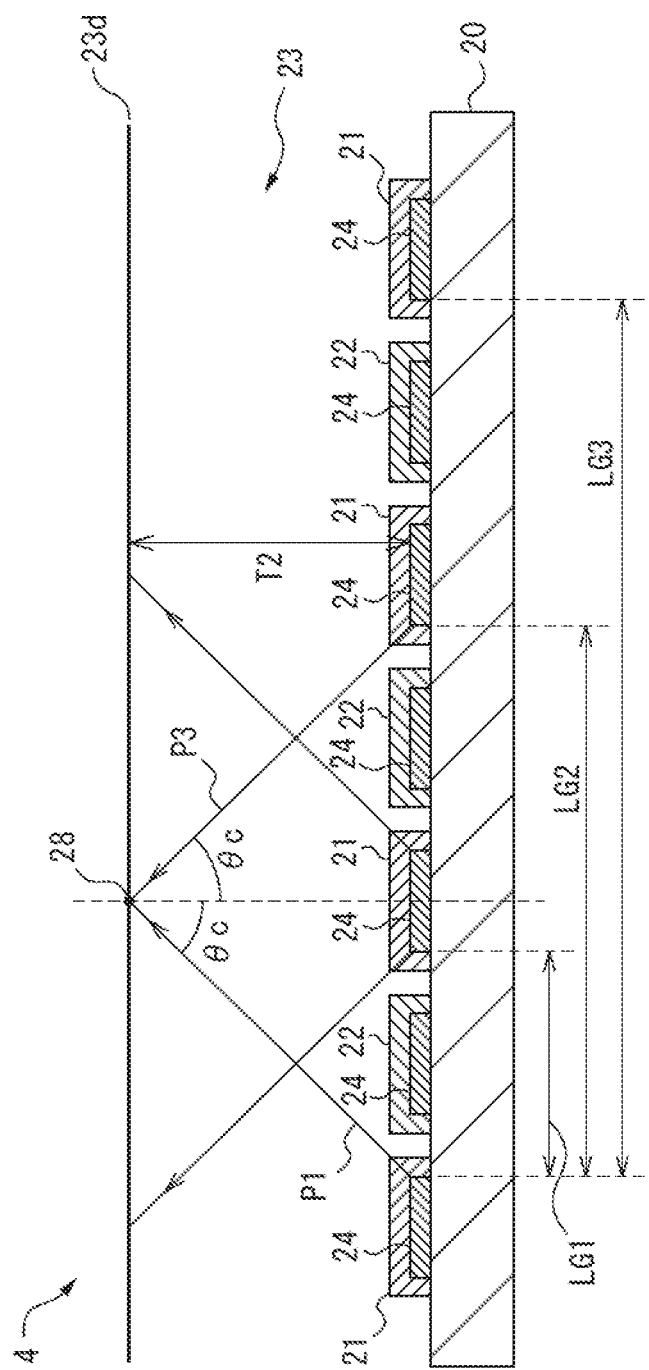
FIG. 9 is a diagram for explaining the thickness of a light guide layer shown in FIG. 7 (Part 1)

FIG. 9 is an explanatory diagram of an optimum value and the upper limit value of the thickness T between the upper surfaces of the LED dies 24 of the first and second light emitting elements 21 and 22 and the upper surface of the light guide layer 23, and is a cross-sectional view of the light emitting device 4 along B-B' line shown in FIG. 7.

Light P1 is emitted from a side facing a second light emitting element 22 of an LED die 24 of a first light emitting element 21, and is incident to the upper surface of the light guide layer 23 at a critical angle θc. Light P3 is emitted from a side facing a second light emitting element 22 of an LED die 24 of a first light emitting element 21 adjacent to the LED die 24 of the first light emitting element 21 emitting light P1 arranged through one first light emitting element 22 and two second light emitting elements, and is incident to the upper surface of the light guide layer 23 at a critical angle θc. When a position of the upper surface of the light guide layer 23 is a fourth position 23d, and the thickness between the upper surfaces of the LED dies 24 of the first and second light emitting elements 21 and 22 and the upper surface of the light guide layer 23 is T2, the light P1 and the light P3 are intersect at an intersection 28 of the upper surface of the light guide layer 23.

The thickness T2 between the upper surfaces of the LED dies 24 of the first and second light emitting elements 21 and 22 and the upper surface of the light guide layer 23 has a relation indicated by the equation (2) with respect to the critical angle θc of light emitted from the light guide layer 23 to the air, and a distance LG2 between LED dies 24 of adjacent first light emitting elements 21 through one first light emitting element 21 and the two second light emitting elements 22. Since it is preferable that the light guide layer 23 is thinner in order to suppress a decrease of the luminous efficiency, the optimum value of the thickness T between the upper surfaces of the LED dies 24 of the first and second light emitting elements 21 and 22 and the upper surface of the light guide layer 23 is T2.

When the thickness between the upper surfaces of the LED dies 24 of the first and second light emitting elements 21 and 22 and the upper surface of the light guide layer 23 is equal to or longer than T1 and equal to or shorter than T2, the light emitting device 4 may improve color mixing property of the light emitted from the first and second light emitting elements 21 and 22.

(Configuration and Function of the Light Emitting Device According to the Third Embodiment)

Figure 10:
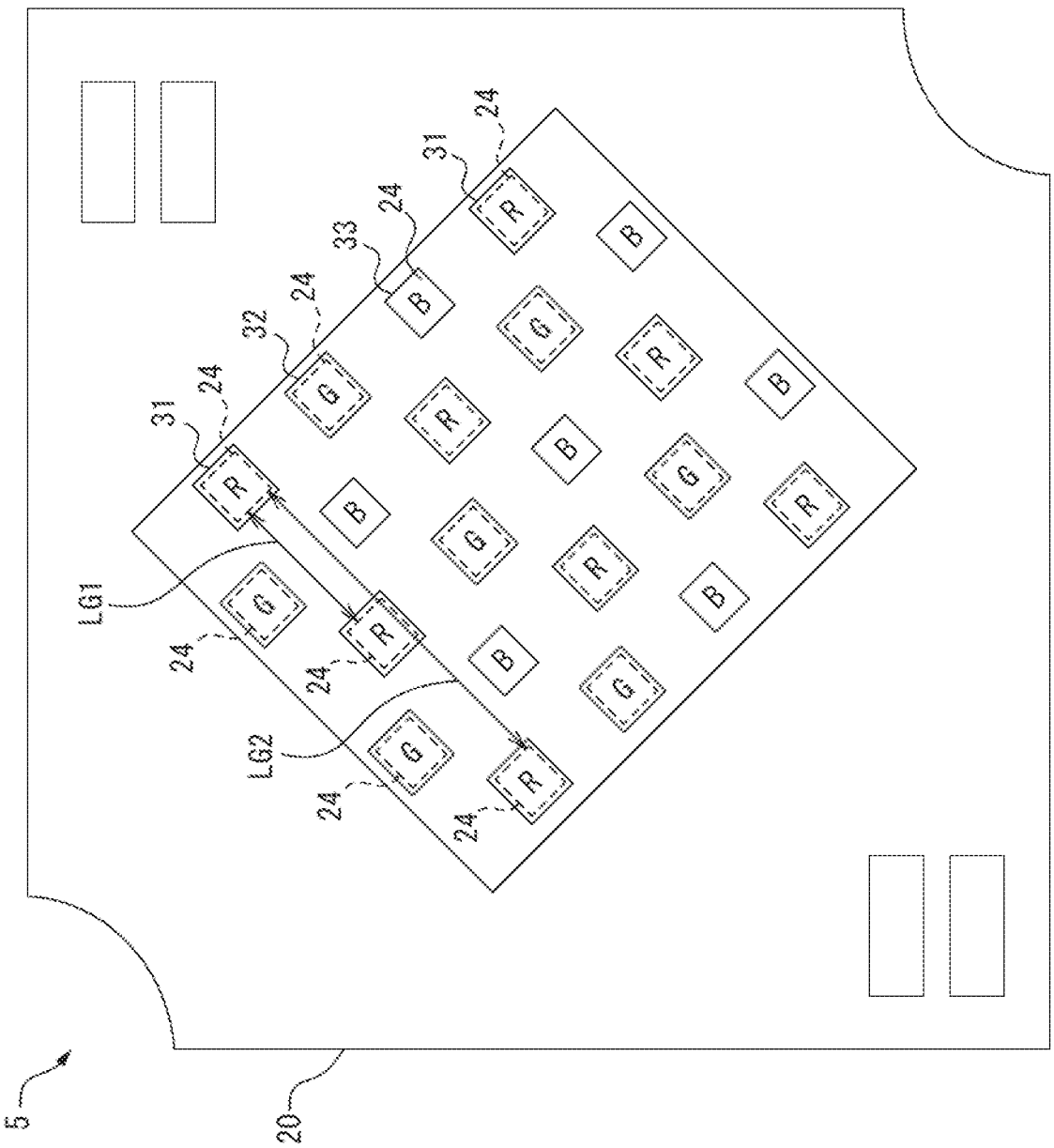
FIG. 10 is a plan view of a light emitting device according to the third embodiment.

FIG. 10 is a plan view of a light emitting device according to the third embodiment. A light emitting device 5 is different from the light emitting device 3 in that the light emitting device 5 includes first light emitting elements 31, second light emitting elements 32 and third light emitting elements 33 which are delta-arranged, and emit light having wavelengths corresponding to RGB colors, instead of the first light emitting elements 21 and second light emitting elements 22. Since configurations and functions of components in the light emitting device 5 except for the first light emitting elements 31, the second light emitting elements 32 and the third light emitting elements 33 are the same as those in the light emitting device 3 having the same reference numerals, a detailed description thereof will be omitted.

The first light emitting element 31 is formed of a blue LED die 24, and a silicone resin containing phosphor for emitting red light such as CASN and coating the blue LED die, and emits red light. The dominant wavelength of the red light emitted from the first light emitting element 31 is within a scope between 600 nm and 680 m and is, for example, 660 nm. The second light emitting element 32 is formed of a blue LED die 24 and a silicone resin containing phosphor for emitting green light such as YAG and coating the blue LED die 24, and emits green light. The dominant wavelength of the green light emitted from the second light emitting element 32 is within a scope between 500 nm and 570 m, and is, for example, 550 nm. The third light emitting element 33 is formed by a blue LED die 24, and emits blue light. The dominant wavelength of the blue light emitted from the third light emitting element 33 is within a scope between 445 nm and 495 nm, and is, for example, 450 nm. The LED dies 24 included in the first light emitting elements 31 are also referred to as first LED dies, the LED dies 24 included in the second light emitting elements 32 are also referred to as second LED dies, and the LED dies 24 included in the third light emitting elements 33 are also referred to as third LED dies.

A distance between LED dies 24 of adjacent first light emitting elements 31 is LG1, a distance between LED dies 24 of first light emitting elements 31 arranged through one first light emitting element 31 is LG2. A thickness T between the upper surfaces of the LED dies 24 of the first, and third light emitting elements 31 to 33 and the upper surface of the light guide layer 23 is equal to or longer than T1 calculated by the equation (1) by the distance LG1 between LED dies 24 of adjacent first light emitting elements 31. Further, thickness T between the upper surfaces of the LED dies 24 of the first, and third light emitting elements 31 to 33 and the upper surface of the light guide layer 23 is equal to or shorter than T2 calculated by the equation (2) by the distance LG2 between LED dies 24 of first light emitting elements 31 arranged through one first light emitting element 31. The thickness T may be equal to or longer than T1 calculated by the equation (1) by the shortest distance between LED dies 24 of adjacent first light emitting elements 31. The thickness T may be equal to or shorter than T2 calculated by the equation (2) by the longest distance between LED dies 24 of adjacent first light emitting elements 31.

The thickness T may be equal to or longer than T1 calculated by the equation (1) by the shortest distance between LED dies 24 of adjacent second light emitting elements 32, or adjacent third light emitting elements 33. The thickness T may be equal to or shorter than T2 calculated by the equation (2) by the longest distance between LED dies 24 of adjacent second light emitting elements 32, or adjacent third light emitting elements 33. The light emitting device 5 may further include a diffusion layer for diffusing light guided by the light guide layer 23, and arranged so as to cover the light guide layer 23.

(Configuration and Function of the Light Emitting Device According to the Fourth Embodiment)

Figure 11:
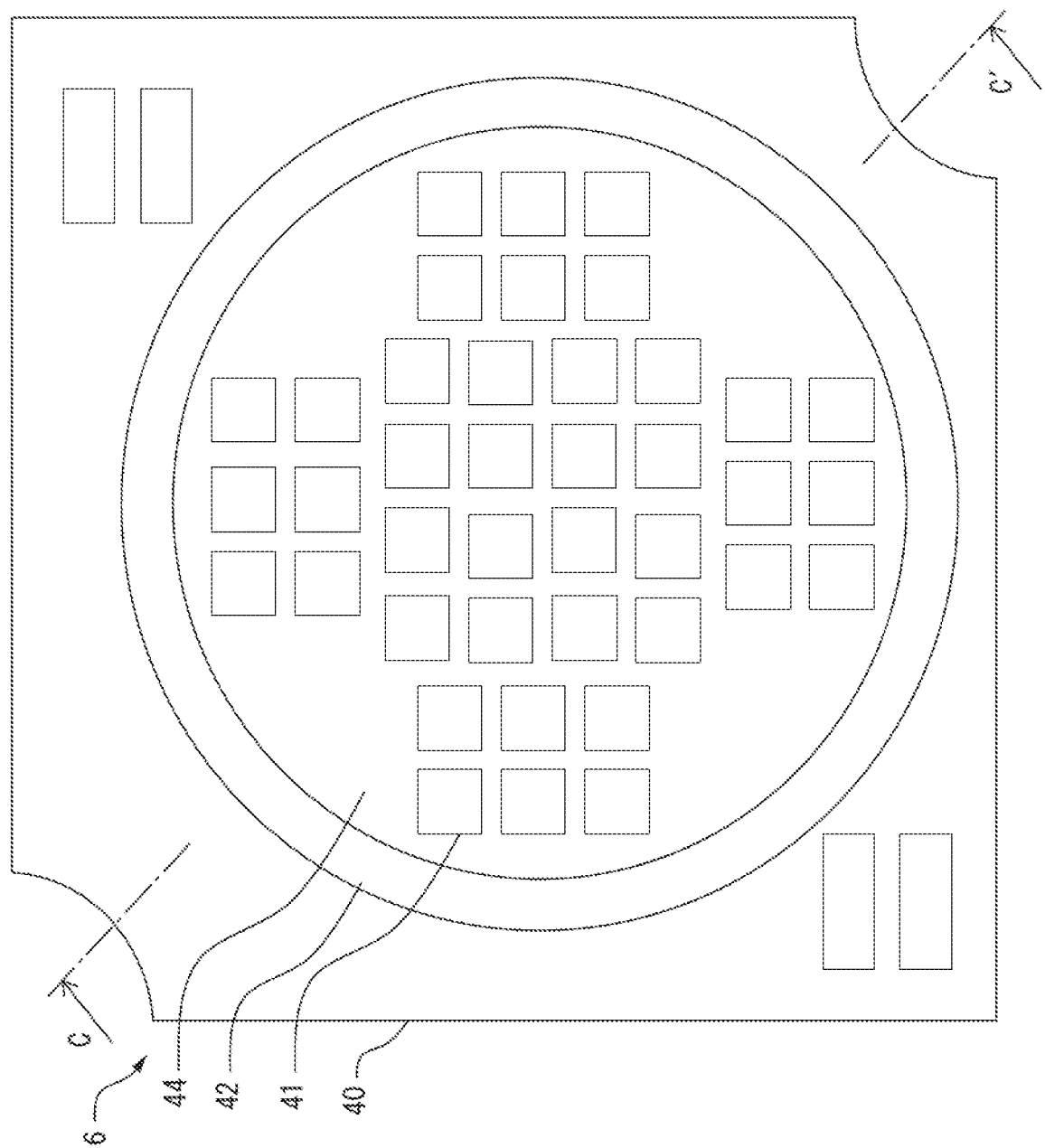
FIG. 11 is a plan view of a light emitting device according to the fourth embodiment.

FIG. 11 is a plan view of a light emitting device according to the fourth embodiment, FIG. 12A is a cross-sectional view of a light emitting device along C-C' shown in FIG. 11 (part 1), FIG. 12B is a cross-sectional view of a light emitting device along C-C' shown in FIG. 11 (part 2). The light emitting device 6 includes a substrate 40, first light emitting elements 41, a reflector 42, a light guide layer 43 and a diffusion layer 44. The substrate 40 has the same configuration and function as the substrate 20. The first light emitting element 41 is formed by a blue LED die, and emits blue light. The dominant wavelength of the blue light emitted from the first light emitting element 41 is within the scope between 445 nm and 495 nm, and is, for example, 450 nm. The reflector 42 is formed of a silicone resin containing white particles such as titanium oxide, and is arranged so as to surround the first light emitting element 41. The light guide layer 43 includes a phosphor layer 45 and a transparent layer 46.

The phosphor layer 45 is a silicone resin containing phosphor such as YAG absorbing light emitted from the first light emitting element 41 and emitting yellow light. The transparent layer 46 is a silicone resin which transmits light emitted from the first light emitting elements 41 and the phosphor contained in the phosphor layer 45.

The diffusion layer 44 is a diffusion agent containing a filler in a silicone resin, a sheet containing diffusion particles, applied fine particle powder, prisms, etc., and preferably has more forward scattering and less backward scattering. The diffusion layer 44 may be a light transmitting plate having emboss processing on the upper or lower surface. The diffusion layer 44 improves the uniformities of brightness and mixed color at the upper surface of the transparent layer 46. Further, since light is emitted from the entire upper surface of the diffusion layer 44, when the light emitting device 6 is attached to a lighting fixture, the diffusion degree of a diffusion member included in the lighting fixture may be reduced, and therefore a decrease of the luminous efficiency is suppressed. The diffusion layer 44 may be omitted.

The thickness T between the upper surfaces of the first light emitting elements 41 and the upper surface of the light guide layer 43 is equal to or longer than T1 calculated by the equation (1) by a distance between adjacent first light emitting elements 41. Further, the thickness T between the upper surfaces of the first light emitting elements 41 and the upper surface of the light guide layer 43 is equal to or shorter than T2 calculated by the equation (2) by a distance between two first light emitting elements 41 arranged through one first light emitting element 41.

A thickness Tk of the diffusion layer 44 is preferably longer than zero and is shorter than the thickness T between the upper surfaces of the first light emitting elements 41 and the upper surface of the light guide layer 43. It is further preferable that the thickness Tk of the diffusion layer 44 is 0.3 times longer than the thickness T between the upper surfaces of the first light emitting elements 41 and the upper surface of the light guide layer 43, and is 0.5 times shorter than the thickness T between the upper surfaces of the first light emitting elements 41 and the upper surface of the light guide layer 43.

When the thickness T between the upper surfaces of the first light emitting elements 41 and the upper surface of the light guide layer 43 is equal to or longer than 1.0 mm and equal to or shorter than 1.5 mm, and the thickness of the diffusion layer 44 is 0.5 mm, a variation range of the front brightness of the light from the first light emitting element 41 is a good value of 40%. When the light guide layer 43 is not arranged and the thickness of the diffusion layer 44 is 1.25 mm, the total luminous flux of light from the first light emitting elements 41 is reduced by 7.5% compared with the case where the diffusion layer 44 is not arranged. On the other hand, when the thickness of the light guide layer 43 is 1.25 mm and the thickness of the diffusion layer 44 is 0.5 mm, the total luminous flux of light from the first light emitting elements 41 is reduced by 3.9% as compared with the case where the diffusion layer 44 is not arranged, and reduction of the total luminous flux is suppressed compared with the case where the light guide layer 43 is not arranged. When the thickness T between the upper surfaces of the first light emitting elements 41 and the upper surface of the light guide layer 43 is equal to or longer than 1.0 mm and equal to or shorter than 1.5 mm, and the thickness of the diffusion layer 44 is 0.5 mm, the thickness Tk of the diffusion layer 44 is included in a range between 0.3 times longer than the thickness T and 0.5 times shorter than the thickness T. When the thickness Tk of the diffusion layer 44 is included in the range between 0.3 times longer than the thickness T and 0.5 times shorter than the thickness T, a variation width of the front brightness of the light from the first light emitting elements 41 is reduced, and a decrease of the total luminous flux is suppressed.

A yellow ring is a phenomenon in which blue light emitted from the first light emitting elements 41 and yellow light emitted from the phosphor contained in the phosphor layer 45 are not mixed, and the yellow ring occurs in the vicinity of the inner wall of the reflector 42.

In FIG. 12A, a distance between a first light emitting element 41 adjacent to the reflector 42 and the reflector 42 is LB1, light P4 is emitted from a side facing the reflector 42 of the first light emitting element 41, and is incident to the upper surface of the light guide layer 23 at a critical angle θc. A lower limit value T3 of the thickness T between the upper surfaces of the first light emitting elements 41 and the upper surface of the light guide layer 43 is indicated by $$T3 = LG1/(2 \tan \theta c) \qquad (3)$$

The distance LB1 between a first light emitting element 41 adjacent to the reflector 42 and the reflector 42 is shorter than the Ttanθc. The distance LB1 is the smallest distance between a corner that is not surrounded by other first light emitting elements 41 and the reflector 42, in which portions of at least two sides of the first light emitting element 41 do not face other first light emitting elements 41.

Further, in FIG. 12B, a distance between a first light emitting element 41 arranged adjacent to the reflector 42 through one first light emitting element 41 and the reflector 42 is LB2, and light P5 is emitted from a side facing the reflector 42 of the first light emitting element 41 arranged adjacent to the reflector 42 through the one first light emitting elements 41, and is incident to the upper surface of the light guide layer 23 at a critical angle θc. When the distance between the first light emitting element 41 arranged adjacent to the reflector 42 through the one first light emitting element 41 and the reflector 42 is LB2 are used, the maximum value T4 of the thickness T between the upper surface of the first light emitting elements 41 and the upper surface of the light guide layer 43 is indicated by $$T4 = LG2/(2 \tan \theta c) \qquad (4)$$

The distance LB2 between the first light emitting element 41 arranged adjacent to the reflector 42 through the one first light emitting element 41 and the reflector 42 is longer than the Ttanθc.

(Light Emitting Device According to a Modification)

Figure 13A:
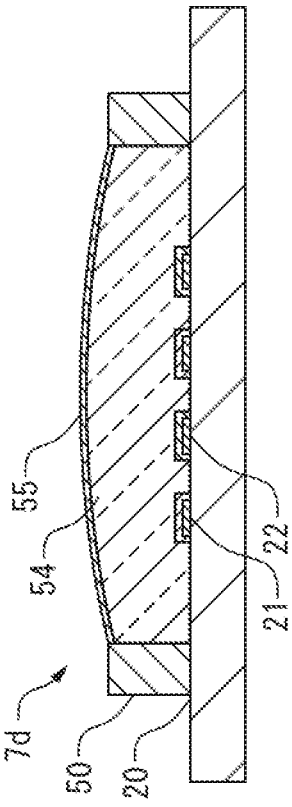
FIG. 13A is a cross-sectional view of a light emitting device according to a first modification.
Figure 13B:
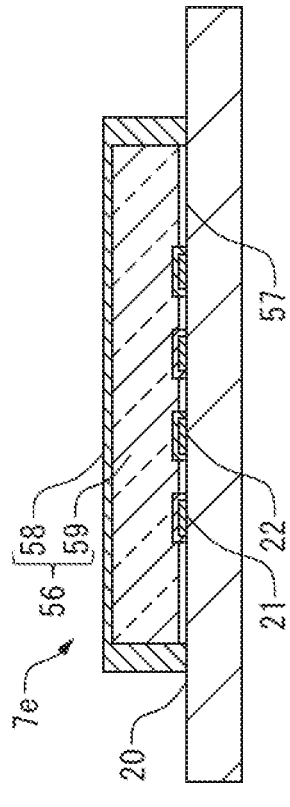
FIG. 13B is a cross-sectional view of a light emitting device according to a second modification.
Figure 13C:
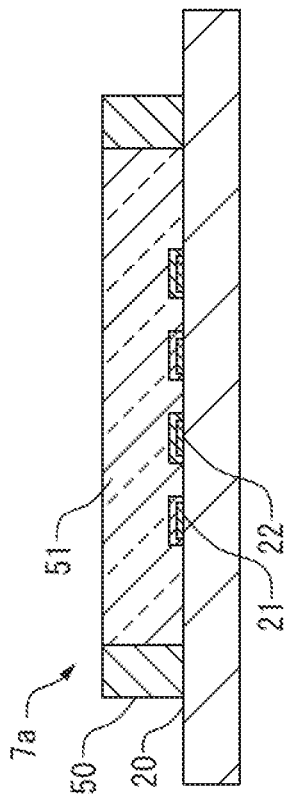
FIG. 13C is a cross-sectional view of a light emitting device according to a third modification.
Figure 13D:
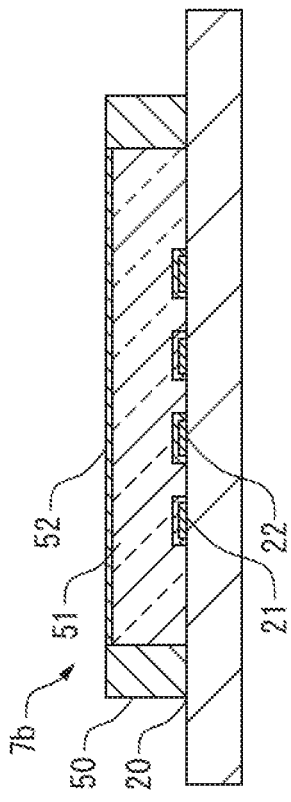
FIG. 13D is a cross-sectional view of a light emitting device according to a fourth modification.
Figure 13E:
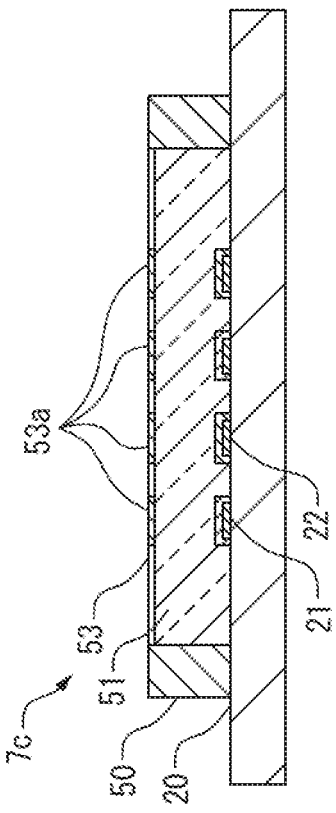
FIG. 13E is a cross-sectional view of a light emitting device according to a fifth modification.

FIG. 13A is a cross-sectional view of a light emitting device according to a first modification, FIG. 13B is a cross-sectional view of a light emitting device according to a second modification, and FIG. 13C is a cross-sectional view of a light emitting device according to a third modification. FIG. 13D is a cross-sectional view of a light emitting device according to a fourth modification, FIG. 13E is a cross-sectional view of a light emitting device according to a fifth modification. FIGS. 13A to 13E are cross-sectional views corresponding to the cross-sectional view along the line A-A' shown in FIG. 2.

A light emitting device 7a according to the first modification is different from the light emitting device 3 in that the light emitting device 7a includes a reflector 50 and the light guide layer 51 instead of the light guide layer 23. Since configurations and functions of components in the light emitting device 7a except for the reflection element 50 and the light guide layer 51 are the same as those in the light emitting device 3 having the same reference numerals, a detailed description thereof will be omitted.

Similar to the reflector 42, the reflector 50 is formed of a silicone resin containing white particles such as titanium oxide, and is arranged so as to surround the first and second light emitting elements 21 and 22. The light guide layer 51 is a silicone resin filled in a region surrounded by the reflector 50, and transmits light emitted from the first and second light emitting elements 21 and 22. The light guide layer 51 is formed by heating the substrate 20 to cure pre-curing resin material, after the pre-curing resin material is filled in the region surrounded by the reflector 50. Since the light emitting device 7a includes the reflector 50, the light emitting device 7a may emit light having high directional characteristics from the upper surface of the light guide layer 51. Although the light emitting devices 3 to 5 do not include a reflector, the light emitting devices 3 to 5 may further include a reflector that is arranged on the substrate so as to surround the plurality of first light emitting elements and reflects light emitted from the first light emitting elements.

The light emitting device 7b according to the second modification is different from the light emitting device 7a in that the light emitting device 7b includes a diffusion layer 52. Since configurations and functions of components in the light emitting device 7b except for the diffusion layer 52 are the same as those of elements of the light emitting device 7a having the same reference numerals, a detailed description thereof will be omitted.

Similarly to the diffusion layer 44, the diffusion layer 52 is a sheet containing diffusion particles, coated fine particle powder, a prism and etc., is connected to the light guide layer 51, by adhering the lower surface of the diffusion layer 52 to the upper surface of the light guide layer 51. The light emitting device 7b includes the diffusion layer 52, and therefore the light emitting device 7b may emit light having high uniformity of brightness and high color mixing. Although the light emitting devices 3 to 5 do not include a diffusion layer, the light emitting devices 3 to 5 further include a diffusion layer for diffusing the light guided through the light guide layer, and arranged so as to cover the light guide layer.

A light emitting device 7c according to a third modification is different from the light emitting device 7b in that the light emitting device 7c includes a diffuse layer 53 instead of the diffusion layer 52. Since configurations and functions of components in the light emitting device 7c except for the diffusion layer 53 are the same as those in the light emitting device 7b having the same reference numerals, a detailed description thereof will be omitted.

The diffusion layer 53 is different from the diffusion layer 52 in that diffusers 53a are formed above the first and second light emitting elements 21 and 22. In the light emitting device 7c, the diffusers 53a are formed on regions above the first and second light emitting elements 21 and 22 where the light emitted from the first and second light emitting elements 21 and 22 has high brightness, and therefore the light emitting device 7c may efficiently mix light having high brightness, and emit light having high uniformity of brightness and high color mixing property while suppressing a decrease of the luminous efficiency.

A light emitting device 7d according to a fourth modification is different from the light emitting device 7b in that the light emitting device 7d includes a light guide layer 54 and a diffusion layer 55 instead of the light guide layer 51 and diffusion layer 52. Since configurations and functions of components in the light emitting device 7d except for the light guide layer 54 and the diffusion layer 55 are the same as those in the light emitting device 7b having the same reference numerals, the detailed description thereof will be omitted.

The light guide layer 54 is different from the light guide layer 51 in that the upper surface of the light guide layer 54 has a convexly curved shape. The diffusion layer 55 is different from the diffusion layer 53 in that the diffusion layer 55 has a convexly curved shape so as to protrude upward at the central portion in accordance with the upper surface shape of the light guide layer 54. Since the light guide layer 54 and diffusion layer 55 have curved lens shapes so as to protrude upward at the central portion, the light emitting device 7d emits light having high directional characteristics.

A light emitting device 7e according to a fifth modification is different from the light emitting device 7a in that the light emitting device 7e includes a frame member 56 and an adhesive layer 57 instead of the reflector 50 and light guide layer 51. Since configurations and functions of components in the light emitting device 7e except for the frame member 56 and adhesive layer 57 are the same as those in the light emitting device 7a having the same reference numerals, and a detailed description thereof will be omitted.

The frame member 56 includes a diffuse frame 58, and a light guider 59. The diffusing frame 58 includes a side portion arranged so as to surround the first and second light emitting elements 21 and 22, and an upper portion covering the upper portion of the first and second light emitting elements 21 and 22, diffuses light emitted from the first and second light emitting elements 21 and 22, and emits the light to the outside. The side portion of the diffusion frame 56 covering the side surface of the light guider 59 functions as a reflective frame, by having thickness thicker than that of the diffusion frame 58 covering the upper surface of the light guider 59. The light guider 59 is formed of a member that transmits light emitted from the first and second light emitting elements 21 and 22 such as a silicone resin, and is integrated with the diffusion frame 58. The adhesive layer 57 is formed of a member for transmitting light emitted from the first and second light emitting elements 21 and 22 such as silicone resin, and is an adhesive member for adhering the frame member 56 to the substrate 20.

In the light emitting device 7e, since the frame member 56 includes the diffusing frame 58 and light guider 59, no reflectors also referred to as dam materials are arranged, and therefore the manufacturing process thereof may be simplified. Further, in the light emitting device 7e, since the diffusing frame 58 and light guider 59 are integrated by the frame member 56, the light guider 59 having uniformly thickness may be easily formed. Further, in the light emitting device 7e, a diffusion layer having a desired diffusion degree may be easily formed, by adjusting the diffusion degree of the diffusion frame 58. Although the frame member 56 functions as a reflective frame by increasing the thickness of the side surface of the light guider 59, in the light emitting device according to the embodiment, a material having a high reflectivity may be arranged on the side surface of the light guider 59.

FIG. 14A is a cross-sectional view of a light emitting device according to a sixth modification, FIG. 14B is a cross-sectional view of a light emitting device according to a seventh modification, FIG. 14C is a cross-sectional view of a light emitting device according to an eighth modification, and FIG. 14D is a cross-sectional view of a light emitting device according to a ninth modification. FIG. 14E is an enlarged view of a portion indicated by an arrow D in FIG. 14A, FIG. 14F is an enlarged view of a portion indicated by an arrow E in FIG. 14B, and FIG. 14G is an enlarged view of a portion indicated by an arrow F in FIG. 14C. FIG. 14A to FIG. 14D are cross-sectional views corresponding to the cross-sectional views along the line A-A' shown in FIG. 2.

A light emitting device 8a is different from the light emitting device 7b in that the light emitting device 8a includes a white resin 60. Since configurations and functions of components in the light emitting device 8a except for the white resin 60 are the same as those in the light emitting device 7b having the same reference numerals, a detailed description thereof will be omitted.

Similar to the reflector 42, the white resin 60 is formed of a silicone resin containing white particles such as titanium oxide, and is arranged among the first and second light emitting elements 21 and 22. In the light emitting device 8a, since the white resin 60 is arranged among the first and second light emitting elements 21 and 22, the amount of light absorbed by the substrate 40 is suppress, and therefore the luminous efficacy may be improved. The reflector 50 and diffusion layer 52 may be omitted.

A light emitting device 8b is different from the light emitting device 8a in that the light emitting device 8b includes first light emitting elements 61 and second light emitting elements 62 instead of the first and second light emitting elements 21 and 22. Since configurations and functions of components in the light emitting device 8b except for the first light emitting elements 61 and the second light emitting elements 62 are the same as those in the light emitting device 8a having the same reference numerals, and a detailed description thereof will be omitted.

The first and second light emitting elements 61 and 62 are different from the first and second light emitting elements 21 and 22 in that the side surfaces of the fluorescent resins included in the first light emitting elements 61 and second light emitting elements 62 is arranged so as not to extend in the vertical direction, but to incline outer toward the upper direction. In the light emitting device 8b, since the white resin 60 is arranged among the first and second light emitting elements 61 and 62, the white resin 60 functions as a reflector, and therefore the luminous efficiency may be further improved. The reflector 50 and the diffusion layer 52 may be omitted.

A light emitting device 8c is different from the light emitting device 8a in that the light emitting device 8c includes a white resin 60a instead of the white resin 60. Further, the light emitting device 8c is different from the light emitting device 8a in that the light emitting device 8c includes transparent resins 60b. Since configurations and functions of components in the light emitting device 8c except for the white resin 60a and the transparent resins 60b are the same as those in the light emitting device 8a having the same reference numerals, and a detailed description thereof will be omitted.

The white resin 60a is different from the white resin 60 in that recesses in which the transparent resins 60b are formed among the first and second light emitting elements 21 and 22. Since configurations and the functions of the white resin 60a except for the configuration in which the recesses are formed are the same as those of the white resin 60, a detailed description thereof will be omitted. The transparent resins 60b are arranged among the first and second light emitting elements 21 and 22 and the white frames 63. The transparent resins 60b are arranged along side surfaces of the phosphor resins 25 of the first and second light emitting elements 21 and 22, and a side surface of transparent resin 60b is arranged so as to incline outer toward the upper direction.

A light emitting device 8*d* is different from the light emitting device 8*a* in that a white frame 63 and a frame member 64 are arranged instead of the reflector 50, the light guide layer 51, the diffuser layer 52 and the white resin 60. Since configurations and functions of components in the light emitting device 8*d* except for the white frame 63 and the frame material 64 are the same as those in the light emitting device 8*a* having the same reference numerals, and a detailed description thereof will be omitted.

The white frame 63 is formed of a white resin material having rigidity higher than that of the white resin 60, a plurality of insertion holes in each of which the first and second light emitting elements 21 and 22 are inserted are formed through the white frame 63. The frame material 64 includes a light guide layer 65 and a diffusion layer 66 which is adhered to the light guide layer 65. The light guide layer 65 is a transparent sheet for transmitting light emitted from the first and second light emitting elements 21 and 22, and the diffusion layer 66 is a diffusion sheet for diffusing the light emitted from the first light emitting elements 21 and the second light emitting elements 22.

Figure 15:
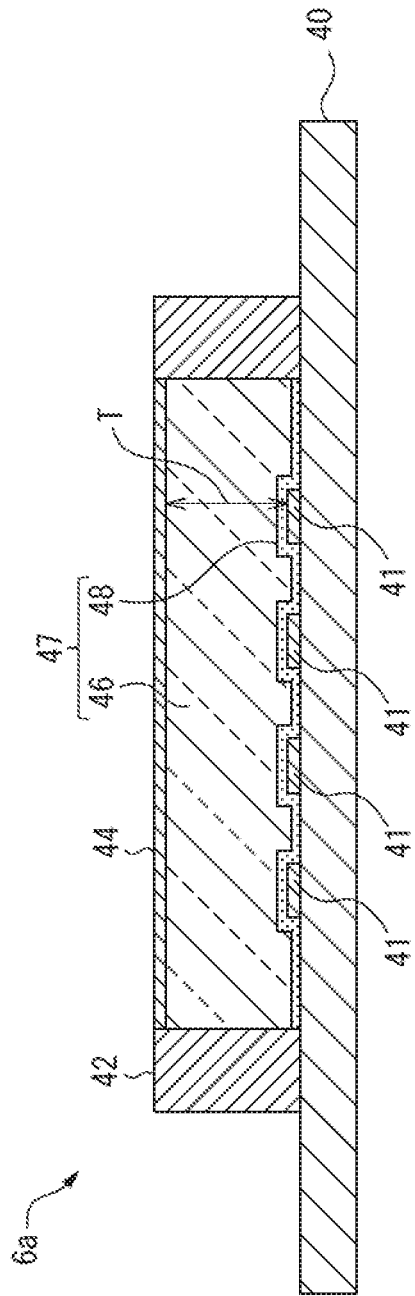
FIG. 15 is a cross-sectional view of a light emitting device according to a tenth modification.

FIG. 15 is a cross-sectional view of a light emitting device according to a tenth modification. A light emitting device 6*a* is different from the light emitting device 6 in that the light emitting device 6*a* includes a light guide layer 47 instead of the light guide layer 43. Since configurations and functions of components in the light emitting device 6*a* except for the light guide layer 47 are the same as those in the light emitting device 6 having the same reference numerals, and a detailed description thereof will be omitted. The light guide layer 47 is different from the light guide layer 43 in that the light guide layer 47 includes a phosphor layer 48 instead of the phosphor layer 45. The phosphor layer 48 is unevenly distributed around the periphery of the first light emitting elements 41. The phosphor layer 48 is formed by sedimentation of phosphor, coating thereof, electrophoresis thereof, and etc.

A thickness T between the upper surfaces of the first light emitting elements 41 and the upper surface of the light guide layer 47 is equal to or longer than T1 calculated by the equation (1) by a distance between adjacent first light emitting elements 41. Further, the thickness T between the upper surfaces of the first light emitting elements 41 and the upper surface of the light guide layer 47 is equal to or shorter than T2 calculated by the equation (2) by a distance between the two first light emitting elements 41 arranged through one first light emitting element 41.

Further, the thickness T between the upper surfaces of the first light emitting elements 41 and the upper surface of the light guide layer 47 is equal to or longer than T3 calculated by the equation (3) by a distance between adjacent first light emitting elements 41. Further, the thickness T between the upper surfaces of the first light emitting elements 41 and the upper surface of the light guide layer 47 is equal to or longer than T3 calculated by the equation (4) by a distance between a first light emitting element 41 adjacent to the reflector 42 and the reflector 42.

In the light emitting device 6*a*, since the light emitted from the first light emitting elements 41 and the light emitted from the phosphor contained in the phosphor layer 48 unevenly distributed around the periphery of the first light emitting elements 41 are emitted through the transparent layer 46, light having a high color mixing property may be emitted.

Figure 16:
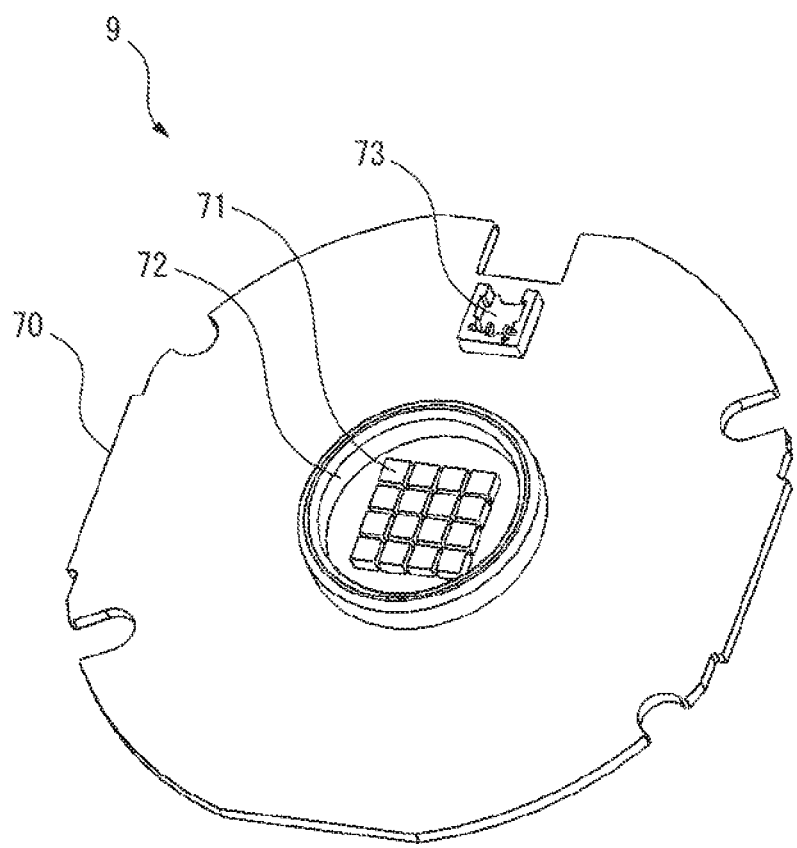
FIG. 16 is a perspective view of a light emitting device according to an eleventh modification.

FIG. 16 is a perspective view of a light emitting device according to an eleventh modification.

A light emitting device 9 includes a substrate 70, a first light emitting element 71, a light guide layer 72 and a connector 73. The substrate 70 is, for example, a glass epoxy substrate, and the wiring patterns for connecting among the first light emitting elements 71 and the connector 73 are formed. The first light emitting elements 71 are SMD type light emitting elements, and are arranged in a matrix of 4×4 at the central portion of the upper surface of the substrate 70. The light guide layer 72 is formed of a silicone resin, and is arranged so as to cover the first light emitting elements 71.

A thickness of the light guide layer 72, i.e., a thickness between the upper surfaces of the LED dies of the first light emitting elements 71 and the upper surface of the light guide layer 72 is equal to or longer than T1 calculated by the equation (1) by a distance between adjacent first light emitting elements 71. Further, the thickness between the upper surfaces of the LED dies of the first light emitting elements 71 and the upper surface of the light guide layer 72 is equal to or shorter than T2 calculated by the equation (2) by a distance between two first light emitting elements 71 arranged through one first light emitting element 71.

The light emitting device 9 using COB type light emitting elements may realize optical properties similar to those of a SMD type light emitting device. Further, since the light emitting device 9 includes a plurality of electronic components mounted on the substrate 70, and a control circuit for controlling emissions of light from a plurality of first light emitting elements and etc., a light emitting device for realizing various controls such as dimming may be mounted on a single substrate.

Figure 17:
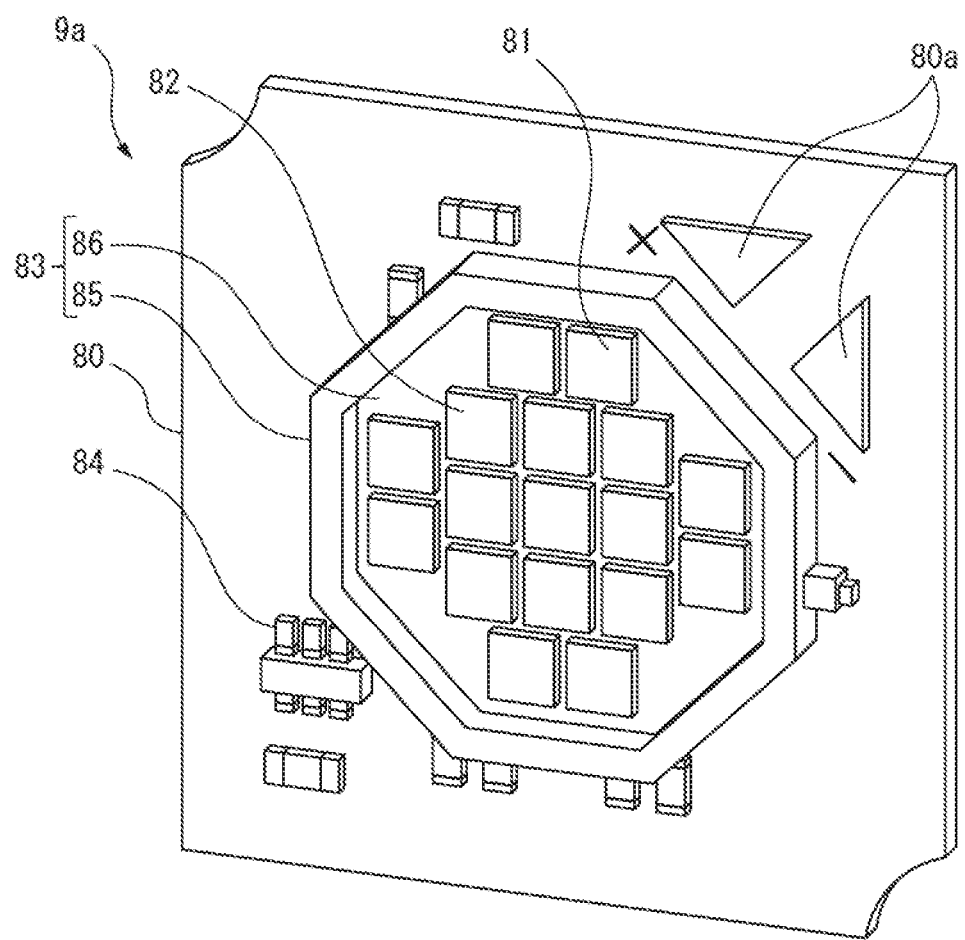
FIG. 17 is a perspective view of a light emitting device according to a twelfth modification.

FIG. 17 is a perspective view of a light emitting device according to a twelfth modification.

A light emitting device 9*a* includes a substrate 80, first light emitting elements 81, second light emitting elements 82, a frame member 83 and electronic components 84. Similar to the substrate 70, the substrate 80 is a glass-epoxy substrate, the pair of electrodes 80*a* are arranged on the substrate 80, and wiring patterns for connecting among the first light emitting elements 81, the second light emitting elements 82, the electronic components 84 and the pair of electrode 80*a* are formed thereon. Similarly to the first and second light emitting elements 21 and 22, the first and second light emitting elements 81 and 82 are CSP type light emitting elements, the first light emitting elements 81 emit cold light, and the second light emitting elements 82 emit warm light. The frame material 83 includes a reflection portion 85 and a light guider 86 which is a light guide layer integrally molded with the reflection portion 85. The reflection portion 85 is a frame material formed of a synthetic resin for reflecting light emitted from the first and second light emitting elements 81 and 82, and is arranged so as to surround the first and second light emitting elements 81 and 82. The light guider 86 is a frame material formed of a synthetic resin for transmitting light emitted from the first and second light emitting elements 81 and 82, and is arranged so as to cover the first and second light emitting elements 81 and 82. The electronic components 84 include resistors, capacitors, MOSFET and semiconductor devices, etc., and provide various controls such as flicker suppression and dimming.

The light emitting device according to the present disclosure may emit light having a high color mixing property while suppressing a decrease amount of light flux, by arranging a light guide layer having a predetermined thickness between light emitting elements and a diffusion layer. In a light emitting device including a light guide layer according to the present disclosure, a variation width of the brightness of emitted light may be suppressed about 20% to 30% as compared with a light emitting device including no light guide layers. Further, in a light emitting device including a light guide layer and a diffusion layer according to the present disclosure may a variation width of the brightness of emitted light may be suppressed about 40% to 60% as compared with a light emitting device including no light guide layers.

Further, in a light emitting device having a light guide layer according to the present disclosure, a variation width of a chromaticity of emitted light may be suppressed about 3% to 30% as compared with a light emitting device including no light guide layers. Further, in a light emitting device having a light guide layer and diffusion layer according to the present disclosure may the variation width of the chromaticity of emitted light may be suppressed about 45% to 75% as compared with a light emitting device including no light guide layers.

Although, in the above described light emitting devices, the light guide layer is formed of a silicone resin, in the light emitting device according to the present disclosure, a light guide layer may be formed of a synthetic resin such as an epoxy resin, a polymethyl methacrylate resin, a polycarbonate resin or a polystyrene resin. Further, although, in the above described light emitting device, the light guide layer is formed of a silicone resin which is a single resin, a light guide layer may be formed by laminating a plurality of synthetic resins having different refractive indices. When a light guide layer is formed by laminating a plurality of synthetic resins having different refractive indices, a thickness of the light guide layer is determined by calculating the equations (1) to (4) for each of resin layers.

Further, in a light emitting device according to the present disclosure, the reflective layer may be formed by a plurality of reflective layers arranged by superimposing on a substrate. When a reflective layer is formed by a plurality of reflective layers arranged by superimposing on a substrate, the center portion of the reflective layer arranged at the uppermost portion may be arranged outside the center portions of the other reflective layers. Since the center portion of the reflective layer arranged at the uppermost portion is arranged outside the center portions of the other reflective layers, when a pre-curing resin of a light guide layer is filled a region surrounded by the reflector, the pre-curing resin of the light guide layer does not rise up to the uppermost portion of the reflective layer, and therefore a light guide layer having a flat upper surface may be formed.

The above described light emitting elements include LED dies 24 emitting blue light and coated by fluorescent resins and etc. In a light emitting device including the color filter, when one white LED is arranged in an area covered by one color of the color filter, and other white LEDs are arranged in an areas covered by other colors, a set of a color arranging an area and a white LED arranged in the corresponding area form a light emitting element. An aggregation of the entire color filters and the white LEDs correspond to a light emitting elements. A light emitting device using white LEDs and a color filter as a light emitting element has relationships described with reference to the equations (1) to (4). Similarly, a micro LED in which fine light emitting portions are arranged and organic EL have the relationships described with reference to the equations (1) to (4).

Further, if light emission amounts of individual light emitting elements may be independently controlled, a light emitting device according to the present disclosure may be used as a display. However, the light emitting device according to the present disclosure may improve the uniformity of the brightness and color mixing property of emitted light, without reducing the resolution thereof.

What is claimed is:

1. A light emitting device comprising:
  a substrate;
  a plurality of first light emitting elements mounted on the substrate, including first light emitting diode (LED) dies, and emitting light having a first wavelength; and
  a light guide layer arranged so as to cover the plurality of first light emitting elements, and guiding the light from the plurality of first light emitting elements, wherein
  when LG1 is a distance between the first LED dies, and $\theta c$ is a critical angle of the light emitted from the light guide layer to air, and a thickness T between upper surfaces of the first light emitting elements and an upper surface of the light guide layer is equal to or longer than T1 indicated by $$T1=LG1/(2 \tan \theta c).$$

2. The light emitting device according to claim 1, wherein, when LG2 is a distance between two first LED dies arranged through one first light emitting element, the thickness T between the upper surfaces of the first light emitting elements and the upper surface of the light guide layer is equal to or shorter than T2 indicated by $$T2=LG2/(2 \tan \theta c).$$

3. The light emitting device according to claim 1, further comprising a plurality of second light emitting elements mounted on the substrate, including second LED dies, and emitting light having a second wavelength different from the first wavelength, wherein the plurality of second light emitting elements are arranged alternately with the first light emitting elements.

4. The light emitting device according to claim 3, further comprising a white resin arranged among the plurality of first light emitting elements and the plurality of second light emitting elements.

5. The light emitting device according to claim 4, wherein
  each of the first light emitting elements further includes a first fluorescent resin arranged as to coat the first LED die,
  each of the second light emitting elements further includes a second fluorescent resin arranged as to coat the second LED die, and
  side surfaces of the first fluorescent resin and the second resin are arranged so as to incline outward in a direction toward a top of the light emitting device.

6. The light emitting device according to claim 5, further comprising transparent resins arrange along the first fluorescent resins and the second fluorescent resins so as to incline outward in the direction toward the top of the light emitting device.

7. The light emitting device according to claim 3, wherein the light guide layer is integrated with a diffusion layer arranged so as to cover the light guide layer, and emitting the light guided through the light guide layer.

8. The light emitting device according to claim 1, further comprising:
  a plurality of second light emitting elements mounted on the substrate, including second LED dies, and emitting light having a second wavelength different from the first wavelength; and
  a plurality of third light emitting elements mounted on the substrate, including third LED dies, and emitting light having a third wavelength different from the first and second wavelengths, wherein
a distance between the first LED dies is equal to or longer than a distance between the second LED dies, and a distance between the third LED dies.

9. The light emitting device according to claim 1, further comprising a reflector arranged on the substrate so as to surround the plurality of first light emitting elements, wherein the light guide layer includes a phosphor layer containing phosphor absorbing the light emitted from the first light emitting elements and emitting light having a second wavelength different from the first wavelength, and a transparent layer which does not contain the phosphor, and
a distance LB1 between a first light emitting element adjacent to the reflector and the reflector is shorter than a distance $T\tan\theta c$.

10. The light emitting device according to claim 9, wherein a distance LB2 between a first light emitting element adjacent to the reflector through one first light emitting element and the reflector through one first light emitting element is longer than the distance $T\tan\theta c$.

11. The light emitting device according to claim 1, further comprising a diffusion layer arranged so as to cover the light guide layer, and emitting the light guided through the light guide layer.

12. The light emitting device according to claim 1, wherein the plurality of first light emitting elements are surface mounted type light emitting elements.

13. The light emitting device according to claim 1, further comprising:
a plurality of electronic components mounted on the substrate; and
a control circuit for controlling emissions of light from the plurality of first light emitting elements.

* * * * *